United States Patent [19]

Asano et al.

[11] Patent Number: 6,106,992
[45] Date of Patent: Aug. 22, 2000

[54] PHOTORESIST FILM AND PROCESS FOR PRODUCING BACK PLATE OF PLASMA DISPLAY PANEL

[75] Inventors: Masaaki Asano; Katsuhiko Mizuno; Hiroshi Funada, all of Tokyo-To, Japan

[73] Assignee: Dai Nippon Printing Co., Ltd., Tokyo, Japan

[21] Appl. No.: 08/967,119

[22] Filed: Nov. 12, 1997

[30] Foreign Application Priority Data

| Nov. 14, 1996 | [JP] | Japan | 8-316871 |
| Feb. 14, 1997 | [JP] | Japan | 9-044970 |
| Feb. 14, 1997 | [JP] | Japan | 9-044971 |
| Apr. 25, 1997 | [JP] | Japan | 9-121478 |

[51] Int. Cl.$^7$ .................................................. G03C 1/76
[52] U.S. Cl. ............................ 430/270.1; 430/6; 430/7; 430/912
[58] Field of Search .................. 430/6, 7, 270.1, 430/912, 320, 322

[56] References Cited

U.S. PATENT DOCUMENTS

| 5,518,843 | 5/1996 | Hara et al. | 430/13 |
| 5,622,794 | 4/1997 | Sato et al. | 430/7 |
| 5,707,781 | 1/1998 | Wilczak | 430/281.1 |
| 5,714,286 | 2/1998 | Uchikawa et al. | 430/6 |
| 5,738,970 | 4/1998 | Hsieh et al. | 430/259 |
| 5,759,739 | 6/1998 | Takemura et al. | 430/270.1 |
| 5,909,083 | 6/1999 | Asano et al. | 313/584 |
| 6,039,622 | 3/2000 | Kosaka et al. | 445/52 |

FOREIGN PATENT DOCUMENTS

10198026 A2   7/1998   Japan .

*Primary Examiner*—Janet Baxter
*Assistant Examiner*—Barbara Gilmore
*Attorney, Agent, or Firm*—Morgan & Finnegan LLP

[57] ABSTRACT

A photoresist film which can form an even fluorescent substance layer, in intimate contact with the surface of cells, in a simplified manner, and a back plate of PDP using the film are provided. More specifically, a photoresist film comprising a base film and, provided on the base film, a photosensitive resin composition layer comprising a fluorescent substance, a photosensitive resin, and a volatile organic material, and a process for producing a back plate of PDP using the film are provided.

4 Claims, 15 Drawing Sheets

↓ DEVELOPER A

↓ BLASTING

PHOTORESIST FILM AND PROCESS FOR PRODUCING BACK PLATE OF PLASMA DISPLAY PANEL

TECHNICAL FIELD

The present invention relates to a photoresist film useful for the production of a fluorescent substance display, such as a plasma display panel (PDP), and a process for producing a back plate of PDP.

BACKGROUND ART

In general, PDP comprises two opposed glass substrates, a pair of electrodes systematically arranged in the glass substrates, and a gas (mainly Ne or the like) sealed therebetween. A voltage is applied across the electrodes to produce discharge within minute cells around the electrodes to emit light from each cell, thereby displaying information. Systematically arranged cells are selectively subjected to discharge luminescence in order to display information. Such PDPs are classified into two types, a direct current type PDP, wherein electrodes are exposed to a discharge space (DC type), and an alternating current type (AC type) wherein electrodes are covered with an insulating layer. Each of these types is further classified into a refresh drive system and a memory drive system according to display functions and memory drive systems.

FIG. 1 is an embodiment of the construction of an AC type PDP. In the drawing, a front plate 1 and a back plate 2 are shown separately from each other. As shown in the drawing, the glass front plate 1 and the back plate 2 are arranged parallel and opposite to each other. Barrier ribs 3 are provided so as to stand in a fixed state on the back plate 2 in its front surface side, and the front plate 1 and the back plate 2 are held while leaving a given distance between the front plate 1 and the back plate 2 by means of the barrier ribs 3. Composite electrodes each comprising a sustaining electrode 4 as a transparent electrode and a bus electrode 5 as a metallic electrode are provided parallel to each other on the front plate 1 in its back plate side, and a dielectric layer 6 is provided so as to cover the composite electrode. Further, a protective layer 7 (MgO layer) is provided on the surface of the dielectric layer 6.

On the other hand, address electrodes 8 are provided between the barrier ribs 3 on the back plate 2 in its front surface side so that the address electrodes 8 are parallel to each other and orthogonal to the composite electrodes. Further, a fluorescent substance 9 is provided so as to cover the wall surface of the barrier ribs 3 and the bottom face of cells.

In the AC type PDP, a predetermined voltage is applied across the composite electrodes on the front plate 1 to create an electric field, thereby producing discharge in each cell as a display element defined by the front plate 1, the back plate 2, and the barrier ribs 3. Ultraviolet light produced by the discharge permits the fluorescent substance 9 to emit light, and light passed through the front plate 1 is viewed by an observer.

Use of a photoresist film comprising a fluorescent substance-containing photosensitive resin composition has been proposed for coating the fluorescent substance (see, for example, Japanese Patent Laid-Open Nos. 273925/1994, 95239/1996, and 95250/1996).

In this coating method, a photosensitive composition is pressed into cells formed in a back plate of PDP, the photosensitive composition is exposed and developed, followed by firing to burn off the organic material in the photosensitive composition, thereby forming a fluorescent substance layer on the surface of the cells. In this case, a satisfactorily large discharge space should be ensured in the cells after the firing, making it necessary to increase the content of the organic material in the photosensitive resin composition, that is, to lower the content of the fluorescent substance. This requires a large quantity of thermal energy and further poses an additional problem that the firing evolves a large amount of gas, rendering the control of the firing oven complicate.

Further, the above method involves a serious problem that, since the photosensitive resin composition pressed into the cells contains a large amount of the organic material, the photosensitive composition shrinks with the elapse of the firing time and the finally formed fluorescent substance layer lifts from the cell surface and does not come into intimate contact with the cell surface.

Accordingly, an object of the present invention is to solve the problems of the prior art and to provide a photoresist film which can form an even fluorescent substance layer in intimate contact with the cell surface through a simple process, and a back plate of PDP using the film.

DISCLOSURE OF THE INVENTION

First aspect

A first aspect of the present invention relates to a photoresist film comprising: a base film; and, provided on the base film, a photosensitive resin composition layer comprising a fluorescent substance, a photosensitive resin, and a volatile organic material, and a process for producing a back plate of PDP using the film.

According to the first aspect of the present invention, the photosensitive resin composition layer laminated on the base film contains a relatively large amount of a volatile organic material. Therefore, pressing of the composition into cells of the back plate of PDP followed by drying and volatilization treatment at a suitable temperature, for example, a temperature of 150 to 300° C., optionally under reduced pressure causes the volume of the photosensitive resin composition in the cells to be reduced, creating a satisfactory discharge space. In the subsequent firing, since the amount of the organic material to be fired has been reduced in the above step, the time and thermal energy necessary for burning off the organic material are small. Further, in this case, the amount of gases evolved in the firing is small, facilitating the control of a firing oven.

The greatest advantage is such that a satisfactorily large discharge space is formed and, in addition, the finally formed fluorescent substance layer is satisfactorily adhered to the surface of cells and, unlike the prior art technique, does not cause lifting or separation of the fluorescent substance and other unfavorable phenomena.

Second aspect

A second aspect of the present invention relates to a process for producing a back plate of PDP, comprising the steps of: pressing a photosensitive fluorescent substance dry film into between a plurality of barrier ribs provided on a substrate; exposing the dry film through a photomask having a desired pattern; developing the exposed dry film to remove unexposed areas; and firing the dry film, wherein the thickness of the dry film is less than the depth of the barrier ribs, the dry film is pressed into between the barrier ribs while leaving a gap between the dry film, pressed into between the barrier ribs, and the substrate, and the dry film is further deeply pressed into between the barrier ribs until it reaches the surface of the substrate.

According to the second aspect of the present invention, the dry film used in the present invention has a smaller thickness than the cell depth and is pressed into the cells. This permits a satisfactorily large discharge space to be formed in the back plate. In the subsequent firing,; since the amount of the organic material to be fired is small, the time and thermal energy necessary for burning off the organic material are small. Further, in this case, the amount of gases evolved in the firing is small, facilitating the control of a firing oven.

The greatest advantage of the present invention is such that a satisfactorily large discharge space is formed within the cells and, in addition, the finally formed fluorescent substance layer within the cells is satisfactorily adhered to the surface of cells and, unlike the prior art technique, does not cause lifting or separation of the fluorescent substance and other unfavorable phenomena.

Third aspect

A third aspect of the present invention relates to a process for producing a back plate of a plasma display panel, comprising the steps of: forming a photoinsensitive fluorescent substance-containing layer on the wall surface and the bottom face between a plurality of barrier ribs provided on a substrate; forming a photosensitive resin layer containing substantially no fluorescent substance between barrier ribs on the fluorescent substance-containing layer; exposing the photosensitive resin layer through a photomask having a desired pattern; developing the exposed photosensitive resin layer to remove unexposed areas; removing the fluorescent substance-containing layer in the unexposed areas; removing the photosensitive resin layer in exposed areas; and firing the fluorescent substance-containing layer in the exposed areas, and a dry film for the above method.

According to the third aspect of the present invention, the fluorescent substance-containing layer formed in the present invention contains a fluorescent substance in a high content, the photosensitive resin layer formed thereon contains substantially no fluorescent substance, and firing is carried out after the photosensitive resin layer is developed and removed. Therefore, only the layer containing the fluorescent substance in a high content is fired, and the amount of the organic material to be burned off is small. Since the fluorescent substance-containing layer is not required to be photosensitive, it is possible to use a vehicle resin which can be easily burned off even at a low temperature (for example, a cellulosic resin for an screen ink). For the above reason, the time and thermal energy required to burn off the organic material are small. Further, the amount of gases evolved in the firing is small, facilitating the control of a firing oven. Furthermore, a satisfactorily large discharge space is created in the cells, and the fluorescent substance layer finally formed in the cells is satisfactorily adhered to the surface of cells and, unlike the prior art technique, does not cause lifting or separation of the fluorescent substance and other unfavorable phenomena.

In the prior art technique, the mask exposure for the formation of fluorescent substance layers for emission of three respective colors should be carried out three times. By contrast, according to the method of the present invention, desired fluorescent substance layers for emission of three respective colors can be formed by conducting the exposure twice.

Fourth aspect

In the conventional photolithography, a coating, a paste, or a flexible film containing a fluorescent substance capable of emitting a specific color and a photosensitive binder are filled into all spaces between the ribs for RGB (red, green, and blue), ultraviolet light is then applied through a photomask corresponding to a specific color to cure exposed areas, and unexposed areas are removed with a developing solution to form a fluorescent substance layer for a specific color. The above procedure is carried out once for each of fluorescent substance compositions for three colors of RGB, thereby forming cells covered respectively with fluorescent substance layers for three colors of RGB.

In the conventional method, as shown in FIG. 16A, a red-emitting fluorescent substance paste is coated between barrier ribs 763 provided on a substrate 762, and the coating is dried to form a fluorescent substance layer. FIG. 16A shows the fluorescent substance paste coating after drying and before firing. Subsequent exposure and development through a predetermined photomask often causes a red-emitting fluorescent substance to remain unremoved as a residual fluorescent substance 764' in areas other than areas 764 for red due to underdevelopment (FIG. 16B). In the formation of a green-emitting fluorescent substance 765 in the subsequent step, coating of a green-emitting fluorescent substance paste and drying the coating followed by exposure and development in the same manner as used in the formation of the red-emitting fluorescent substance layer often causes the green-emitting fluorescent substance to remain unremoved as a residual fluorescent substance 765' in areas other than areas for green due to underdevelopment. This is true of the formation of a blue-emitting fluorescent substance layer (not shown).

Thus, other fluorescent substances are mixed in each area of RGB, posing a problem that lights emitted from the cells are not pure RGB but mixed color lights, resulting in display of an image having deteriorated quality.

It is very difficult to solve the above problem by regulating the photosensitivity of the fluorescent substance-containing photosensitive composition, exposure, and developing capacity of the developing solution. Specifically, among the fluorescent substance layers for three colors, the fluorescent substance layer which is coated first is developed three times until the formation of cells for RGB is completed. The fluorescent substance layer which is coated second is developed twice, and the fluorescent substance layer which is coated third is developed once. Therefore, improving the developability of the fluorescent substance for R can prevent the fluorescent substance layer for R remaining in other areas. In this case, however, the fluorescent substance layer for red cannot withstand three developments.

When the development resistance of the fluorescent substance layer for red is enhanced, as described above, the fluorescent substance layer for red remains removed also in areas other than areas for read. This is true of the fluorescent substance layer which is formed second. Thus, the formation of fluorescent substance layers by the conventional photolithography had the above serious problem.

Another problem of the formation of fluorescent substance layers by the conventional photolithography is such that the fluorescent substance paste used in the formation of the fluorescent substance layer should be photosensitive. Since the photosensitive resin constituting the fluorescent substance paste should be burned off at the time of the formation of the fluorescent substance layer, the type of photosensitive resins usable in this case is limited. Further, in some cases, there is a thermal shrinkage of the fluorescent substance layer on firing, causing the fluorescent substance to be unfavorably separated from the substrate.

Still another serious problem is such that two-third of the red-emitting fluorescent substance paste is removed by development in the formation of the red-emitting fluorescent substance layer, about half of the green-emitting fluorescent substance paste is removed by the development in the formation of the green-emitting fluorescent substance layer, and, in addition, a considerable amount of a blue-emitting fluorescent substance paste is removed by the development in the formation of the blue-emitting fluorescent substance layer. The cost of recovery of the fluorescent substance from the removed paste is high, raising a problem that the product cost of the whole back plate becomes remarkably high.

Accordingly, an object of the fourth aspect of the present invention is to solve the problems of the prior art and to provide a back plate of PDP, which is free from mixing of red-, green-, and blue-emitting fluorescent substances, can emit pure RGB lights, and can display a high-quality image, without wasting the fluorescent substance in a cost-effective manner.

Thus, the fourth aspect of the present invention relates to a process for producing a back plate of a plasma display panel, comprising the steps of: filling a positive-working photosensitive resin into between a plurality of barrier ribs provided on a substrate; exposing the positive-working photosensitive resin through a photomask having a desired pattern; developing the exposed resin to remove exposed areas; filling a fluorescent substance composition into between the barrier ribs from which the positive-working photosensitive resin has been removed; and firing the fluorescent substance composition filled into between the barrier ribs, and a composition for the back plate.

According to the fourth aspect of the present invention, a back plate of PDP, which is free from mixing of red-, green-, and blue-emitting fluorescent substances, can emit pure RGB lights, and can display a high-quality image, can be provided without wasting the fluorescent substance in a cost-effective manner.

The positive-working photosensitive resin used in the present invention is used for temporarily saturating portions between the barrier ribs, and the positive-working photosensitive resin is absent between the barrier ribs at the time of the formation of fluorescent substance layers for three colors and firing. Therefore, there is no need to necessarily select a resin which can be easily burned off, and any positive-working photosensitive resin is usable. Further, since the fluorescent substance composition used in the present invention is not required to be photosensitive, a material which is advantageous for firing, for example, a cellulosic material which can be easily burned off, can be used as the resin component of the composition.

BEST MODE FOR CARRYING OUT THE INVENTION

First aspect

Figure 1:
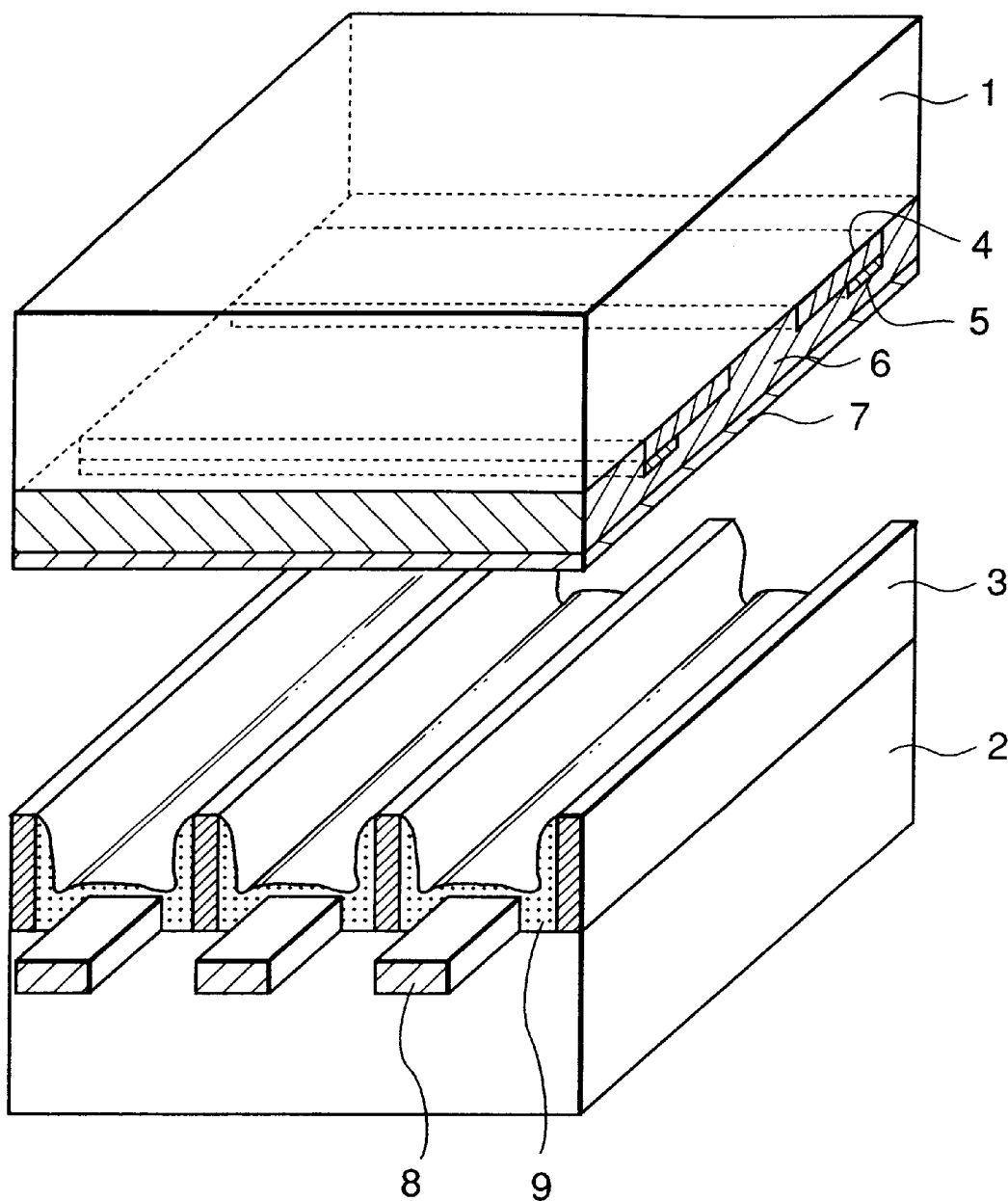
FIG. 1 is a diagram showing the construction of a plasma display panel.

Fluorescent substances used in the present invention are not particularly limited. However, preferred are those wherein the matrix is constituted by a rare earth oxyhalide or the like and has been activated by an activator. Examples of ultraviolet excitation type fluorescent substances include: red-emitting fluorescent substances such as $Y_2O_3$:Eu, $YVO_4$:Eu, and $(Y,Gd)BO_3$:Eu; green-emitting fluorescent substances such as $Zn_2GeO_2$:Mn, $BaAl_{12}O_{19}$:Mn, $Zn_2SiO_4$:Mn, and $LaPO_4$:Tb; and blue-emitting fluorescent substances such as $Sr_r(PO_4)_3Cl$:Eu, $BaMgAl_{14}O_{23}$:$Eu^{2+}$, and $BaMgAl_{16}O_{17}$:Eu. Other fluorescent substances usable herein include: red-emitting fluorescent substances such as $Y_2O_3S$:Eu, $\gamma$—$Zn_3(PO_4)_2$:Mn, and $(Zn,Cd)S$:Ag+$In_2O_3$; green-emitting fluorescent substances such as ZnS:Cu, Al, ZnS:Au, Cu, Al, (Zn, Cd)S:Cu, Al, $Zn_2SiO_4$:Mn, As, $Y_3Al_5O_{12}$:Ce, $Gd_2O_2S$:Tb, $Y_3Al_{15}O_{12}$:Tb, and ZnO:Zn; and blue-emitting fluorescent substances such as ZnS:Ag+red pigment, and $Y_2SiO_3$:Ce. It is a matter of course that these fluorescent substances may be used as a mixture of two or more.

The photosensitive resin used in the present invention comprises a base polymer (a), an ethylenically unsaturated compound (b), and a photopolymerization initiator (c). Examples of the base polymer (a) usable herein include acrylic resin, polyester resin, and polyurethane resin. Among them, an acrylic copolymer, which is composed mainly of a (meth)acrylic ester and if necessary has been copolymerized with an ethylenically unsaturated carboxylic acid or other copolymerizable monomer, is important. An acetoacetyl-containing acrylic copolymer may also be used. (Meth) acrylic esters usable herein include methyl (meth)acrylate, ethyl (meth)acrylate, propyl (meth)acrylate, butyl (meth)acrylate, hexyl (meth)acrylate, 2-ethylhexyl (meth)acrylate, cyclohexyl (meth)acrylate, benzyl (meth)acrylate, dimethylaminoethyl (meth)acrylate, hydroxyethyl (meth)acrylate, hydroxypropyl (meth)acrylate, and glycidyl (meth)acrylate.

Preferred ethylenically unsaturated carboxylic acids usable herein include monocarboxylic acids, such as acrylic acid, methacrylic acid, and crotonic acid. In addition, dicarboxylic acids, such as maleic acid, fumaric acid, and itaconic acid, and anhydrides and half esters thereof may also be used. Among them, acrylic acid and methacrylic acid are particularly preferred. When use of the photosensitive resin composition as a dilute alkali developable type is contemplated, copolymerization of about 15 to 30% by weight (about 100 to 200 mg KOH/g in terms of acid value) of the ethylenically unsaturated carboxylic acid is necessary.

Other copolymerizable monomers usable herein include acrylamide, methacrylamide, acrylonitrile, methacrylonitrile, styrene, $\alpha$-methylstyrene, vinyl acetate, and alkyl vinyl ether.

Ethylenically unsaturated compounds (b) usable herein include polyfunctional monomers such as ethylene glycol di(meth)acrylate, diethylene glycol di(meth)acrylate, tetraethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexane glycol di(meth)acrylate, trimethylolpropane tri (meth)acrylate, glycerin di(meth)acrylate, pentaerythritol di(meth)acrylate, pentaerythritol tri(meth)acrylate, dipentaerythritol penta(meth)acrylate, 2,2-bis(4-(meth) acryloxydiethoxyphenyl)propane, 2,2-bis(4-(meth) acryloxypolyethoxyphenyl)propane, 2-hydroxy-3-(meth) acryloyloxypropyl (meth)acrylate, ethylene glycol diglycidyl ether di(meth)acrylate, diethylene glycol diglycidyl ether di(meth)acrylate, phthalic acid diglycidyl ester di(meth)acrylate, and glycerin polyglycidyl ether poly(meth)acrylate. A suitable amount of a monofunctional monomer may be used together with the polyfunctional monomer.

Examples of monofunctional monomers usable herein include 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, 3-chloro-2-hydroxypropyl (meth)acrylate, glycerin mono(meth)acrylate, 2-(meth)acryloyloxyethyl acid phosphate, half(meth)acrylates of phthalic acid derivatives, and N-methylol (meth)acrylamide.

The amount of the ethylenically unsaturated compound (b) based on 100 parts by weight of the base polymer (a) is preferably 10 to 200 parts by weight, particularly preferably 40 to 100 parts by weight. Use of the ethylenically unsaturated compound (b) in an excessively small amount results in unsatisfactory curing of the photosensitive composition, lowered flexibility of the layer, and delayed development rate of the layer. On the other hand, use of the ethylenically unsaturated compound (b) in an excessively large amount unfavorably results in increased viscosity of the composition, cold flow, and lowered separation rate of the cured resist.

Photopolymerization initiators (c) usable herein include benzoin, benzoin methyl ether, benzoin ethyl ether, benzoin isopropyl ether, benzoin n-butyl ether, benzoin phenyl ether, benzyl diphenyl disulfide, benzyl dimethyl ketal, dibenzyl, diacetyl, anthraquinone, naphthoquinone, 3,3,-dimethyl-4-methoxybenzophenone, benzophenone, p, p'-bis(dimethylamino)benzophenone, p,p'-bis(diethylamino) benzophenone, p,p'-diethylaminobenzophenone, pivalone ethyl ether, 1,1-dichloroacetophenone, p-t-butyldichloroacetophenone, a dimer of hexaarylimidazole, 2,2'-bis(o-chlorophenyl) 4,5,4',5'-tetraphenyl-1,2'-biimidazole, 2-chlorothioxanthone, 2-methylthioxanthone, 2,4-diethylthioxanthone, 2,2'-diethoxyacetophenone, 2,2'-diethoxy-2-phenylacetophenone, 2,2'-dichloro-4-phenoxyacetophenone, phenyl glyoxylate, α-hydroxyisobutylphenone, dibenzospan, 1-(4-isopropylphenyl)-2-hydroxy-2-methyl-1-propanone, 2-methyl-[4-(methylthio)phenyl]-2-morpholino-1-propanone, tribromophenylsulfone, and tribromomethylphenylsulfone. In this case, the total amount of the photopolymerization initiator (c) incorporated is suitably about 1 to 20 parts by weight base on 100 parts by weight in total of the base polymer (a) and the ethylenically unsaturated compound (b).

The volatile organic material used in the present invention is an organic compound which is compatible with the photosensitive resin and is not detrimental to the film-forming properties of the photosensitive resin. Representative examples thereof include plasticizers which have been commonly used as plasticizers for vinyl chloride resin and the like. More specifically, examples of volatile organic materials usable herein include: phthalic esters, for example, dimethyl phthalate, diethyl phthalate, dibutyl phthalate, diheptyl phthalate, dioctyl phthalate, diisodecyl phthalate, butylbenzyl phthalate, diisononyl phthalate, ethylphthalyl-ethyl glycolate, dimethyl isophthalate, and dichlorohexyl phthalate;

fatty acid or aromatic acid (di- or tribasic) esters, for example, dioctyl adipate, diisobutyl adipate, dibutyl adipate, diisodecyl adipate, dibutyl diglycol adipate, dioctyl adipate, dibutyl sebacate, dioctyl sebacate, methyl-acetyl ricinolate, diethyl maleate, dibutyl maleate, dioctyl maleate, dibutyl fumarate, dioctyl fumarate, trioctyl trimellitate, trioctyl trimellitate;

other plasticizers, for example, glycerol triacetate, trimethyl phophate, triethyl phosphate, tributyl phosphate, trioctyl phosphate, tributoxyethyl phosphate, tris-chloroethyl phosphate, tris-dichloropropyl phosphate, triphenyl phosphate, tricresyl phosphate, trixylenyl phosphate, cresyl diphenyl phosphate, pctyl diphenyl phosphate, xylenyl diphenyl phosphate, trilauryl phosphate, tricetyl phosphae, tristearyl phosphate, trioleyl phosphate, triphenyl phosphite, tris-tridecyl phosphite, dibutyl-hydrogen phosphite, dibutyl-butyl phosphonate, di(2-ethylhexyl) 2-ethylhexyl phosphonate, 2-ethylhexyl 2-ethylhexylphosphonate, methyl acid phosphate, isopropyl acid phosphate, butyl acid phosphate, dibutyl acid phosphate, monobutyl acid phosphate, octyl act phosphate, dioctyl phosphate, isodecyl acid phosphate, monoisodecyl phosphate, decanol acid phosphate, and dioctyl phosphate; and Other volatile materials, for example, glycerin, trimethylolpropane, ethylene glycol, diethylene glycol, triethylene glycol, propylene glycol, dipropylene glycol, lower alkyl ethers thereof, lower fatty acid esters, various high fatty acids or esters thereof, and higher fatty acid alcohols or alkyl esters thereof.

As described above, depending upon the type of the photosensitive resin, the volatile organic material is used in such an amount that the film-forming properties of the photosensitive resin are not lost. The weight ratio of the photosensitive resin (A) to the volatile organic material (B) is generally A:B=10:90 to 90:10, preferably A:B=30:70 to 70:30.

The fluorescent substance, the volatile organic material, and other optional components may be incorporated into the photosensitive resin by any method without limitation, examples of methods usable herein include conventional methods, for example, a method wherein the fluorescent substance, the volatile organic and the like in respective predetermined amounts are added to the photosensitive resin and the mixture is thoroughly stirred to homogeneously disperse the fluorescent substance. In this case, the content of the fluorescent substance is preferably 1 to 50 parts by weight, more preferably 10 to 30 parts by weight, based on 100 parts by weight in total of the base polymer and the ethylenically unsaturated compound in the photosensitive resin composition. When the fluorescent substance content exceeds 50 parts by weight, the formation of the dry film becomes difficult, while when it is less than 1 part by weight, the brightness in the form of a fluorescent substance layer is unfavorably likely to lower.

If necessary, other additive, such as dyes (coloring type and color former type), adhesion imparting agents, antioxidants, thermal polymerization inhibitors, solvents, surface tension modifiers, stabilizers, chain transfer agents, antifoaming agents, and flame retardants, may be added to the photosensitive resin composition of the present invention. In particular, incorporation of silane, aluminum, or titanate coupling agents can improve the adhesion of the fluorescent substance layers finally formed within cells in the back plate of PDP to the cell surface. The coupling agent may be previously coated on the surface of the cells in the back plate of PDP.

Silane coupling agents usable herein include, for example, γ-(2-aminoethyl)aminopropyltrimethoxysilane, γ-(2-aminoethyl)aminopropylmethyldimethoxysilane, β-(3,4-epoxycyclohexyl)ethyltrimethoxysilane, γ-aminopropyltriethoxysilane, γ-methacryloxypropyltrimethoxysilane, N-β-(N-vinylbenzylaminoethyl)-γ-aminopropyltrimethoxysilane hydrochloride, γ-glycidoxypropyltrimethoxysilane, aminosilane, γ-mercaptopropyltrimethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, and trimethylchlorosilane.

Titanate coupling agents usable herein include, for example, isopropyltriisostearoyl titanate, isopropyltridodecylbenzenesulfonyl titanate, isopropyltris(dioctylpyrophosphate) titanate, tetraisopropylbis(dioctylphosphite) titanate, tetraoctylbis(ditridecylphosphite) titanate, tetra(2,2-diallyloxymethyl)bis(ditridecyl)phosphite titanate, bis(dioctylpyrophosphate) oxyacetate titanate, bis(dioctylpyrophosphate)ethylene titanate, isopropyltrioctanoyl titanate, isopropyldimethacrylisostearoyl titanate, isopropylisostearoyldiacryl titanate, isopropyltri(dioctylphosphate) titanate, isopropyltricumylphenyl titanate, isopropyltri(N-amidoethyl-aminoethyl) titanate, dicumylphenyloxyacetate titanate, and diisostearoylethylene titanate.

Aluminum coupling agents usable herein include, for example, acetoalkoxyaluminum diisopropylate.

Next, the production of a photoresist film using the above photosensitive resin composition used in the present invention and a method for fluorescent substance pattern formation using the same will be described.

At the outset, the photosensitive resin composition is coated on the surface of a base film, such as a polyester film, a polypropylene film, or a polystyrene film, to form a photosensitive resin composition layer. In this case, if necessary, a protective film, such as a polyethylene film or a polyvinyl alcohol film, may be applied on the photosensitive resin composition layer to prepare a laminate. The thickness of the photosensitive resin composition layer varies depending upon the content of the fluorescent substance and the volatile organic material, the structure of PDP to be produced and the like and cannot be generalized. In general, however, it is suitably selected from 10 to 100 μm.

The photoresist film of the present invention may be used to fix a fluorescent substance to a back substrate, for PDP, with cells being previously provided by glass partitions (a reflection panel). For example, the photoresist film of the present invention may be put on top of the back substrate for PDP, followed by pressing the top surface of the photoresist film by means of a mold, a roll or the like optionally provided with protrusions conforming to recesses of the cells, thereby pressing the photoresist film into the cells. In this case, the photoresist film should be flexible. Therefore, preferably, a highly flexible film, such as a polyvinyl alcohol, nylon, or cellulose film, is used also in the base film or the protective film.

In order to form a desired pattern on the substrate by using the photo resist film, for example, in the case of PDP using a transmission panel, the photosensitive resin composition layer side is applied to the front glass on its anode fixing surface.

The assembly is then dried to remove the volatile organic compound contained in the composition.

This step of drying may be carried out after the exposure and the development. In the drying, the assembly may be heated at a temperature above the volatilization temperature of the volatile organic material, or alternatively may be heated in such a state that the pressure is reduced to lower the volatilization temperature of the volatile organic material. Thereafter, a pattern mask is brought into intimate contact with the base film, followed by exposure. In this case, if necessary, two or more photoresist films may be laminated. The exposure is generally carried out by ultraviolet irradiation. Light sources usable herein include high-pressure mercury lamps, ultrahigh-pressure mercury lamps, carbon arc lamps, xenon lamps, metal halide lamps, and chemical lamps. After the ultraviolet irradiation, if necessary, the exposed assembly may be heated to fully cure the pattern.

When the photosensitive resin composition in the photoresist film of the present invention is of a dilute alkali developable type, the development after the exposure is carried out using an about 1 to 2 wt % dilute aqueous solution of an alkali, such as sodium carbonate or potassium carbonate.

After the completion of the development, the substrate with cells provided therein is fired at 500 to 550° C. to fix the fluorescent substance within cells. Thus, a fluorescent substance can be fixed on the glass substrate. When the formation of a full-color PDP is contemplated, the steps of transfer, exposure, and firing are repeated for photoresist films respectively containing red-, blue-, and green-emitting fluorescent substances.

Second aspect

The second aspect of the present invention relates to a method for fluorescent substance layer formation in a back plate of PDP.

A substrate and ribs constituting the back plate in the present invention may be formed from conventional materials by conventional methods, and there is no particular limitation on the form thereof. The fluorescent substance-containing dry film used in the present invention may be a dry film disclosed, for example, in Japanese Patent Laid-Open Nos. 273925/1994, 95239/1996, and 95250/1996, or a dry film which has been previously proposed by the applicant of the present application (Japanese Patent Application No. 316871/1996).

The method of the present invention is diagrammatically shown in FIGS. 2 and 3. FIGS. 2A and 2B illustrates pressing of a fluorescent substance-containing dry film 23 into portions between a large number of barrier ribs 22 provided on a substrate 21. The dry film 23 comprises a flexible photosensitive resin composition layer 23, comprising at least a fluorescent substance and a photosensitive resin, laminated on a base film 24. In the present invention, the thickness a is smaller than the height of the barrier rib 22, h (cell depth). For example, as diagrammatically shown in FIG. 4 (a cross-sectional view), the dry film used herein comprises a base film 41, formed of polyethylene terephthalate, polyethylene, or polypropylene, and a photosensitive resin layer 42 formed by coating a coating liquid comprising a fluorescent substance-containing photosensitive resin composition onto the base film to a suitable thickness (on a dry basis) and drying the coating. According to a preferred embodiment, a release layer 43 may be provided between the base film 41 and the resin layer 42 to facilitate the separation of the resin layer 42.

A pressure-sensitive adhesive layer 44 may be provided on the surface of the resin layer 42 from the viewpoint of facilitating the transfer of the resin layer onto the back plate of PDP. Further, in order to improve the storage stability of the dry film, the same film as the base film may be applied as a protective layer 45 onto the surface of the resin layer 42 or the pressure-sensitive adhesive layer 44. In use, the protective layer 45 is separated, and the resin layer 42 is transferred onto the surface of the back substrate of PDP.

Figure 2A:
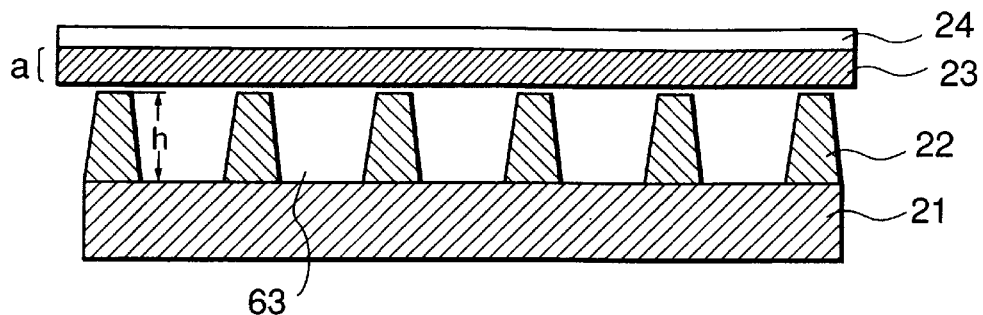
FIGS. 2A to 2D, FIGS. 3A to 3D, FIGS. 6A to 6E, FIGS. 7A to 7D, FIGS. 8A to 8D, FIGS. 9A to 9D, FIGS. 10A to 10D, FIGS. 11A to 11D, FIGS. 12A to 12D, FIGS. 13A to 13D, FIGS. 14A to 14D, and FIGS. 15A and 15B are cross-sectional views showing the steps in the process for producing a back plate of a plasma display panel according to respective embodiments of the present invention.
Figure 2B:
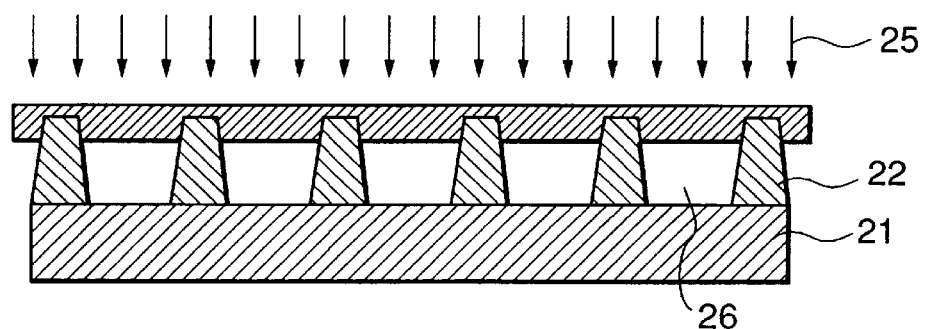

A pressure 25 is applied to the transferred dry film 23 by means of a pair of rubber rolls or the like to press the dry film 23 into the cells 26 in their upper part, and the base film 24 is then separated and removed. Thus, a space 26 is created between the film 23 and the substrate 21 (FIG. 2B). In this case, the thickness a of the dry film is preferably about two-third to one-third of the height (h) of the ribs.

Next, the dry film 23 pressed into the cells 26 in their upper part is further pressed until the dry film 23 reaches the bottom of the cells (second pressing). Preferably, the second pressing is carried out using air pressure, hydraulic pressure, or a cushioning material, such as sponge, so as not to damage the ribs 23. Further, preferably, in the second pressing, the assembly is heated at a temperature of about 80 to 120° C. so as to satisfactorily soften the dry film. For example, when the second pressing is carried out using air pressure, "noncontact gap molding/curing apparatus (LOPSKY)," manufactured by Ropuko may be used.

In this apparatus, a pressure in the form of an air film is applied to the dry film pressed into the cells in their upper part to press the dry film into the cells. In this case, air is ejected through a very large number of holes in upper and lower gaseous film generators to apply a pressure to the dry film from above and below the back plate in such a state that the back plate is floated, thereby permitting the dry film to be pressed into the cells in their bottom. In this case, when the temperature of the air to be ejected from the apparatus is set at a suitable temperature, the dry film can be softened realizing easy and even pressing of the dry film.

The pressing of the dry film may be carried out using a hydraulic pressure, for example, a "water jet resin deburring apparatus (AX series)," manufactured by Rix Corp., instead of the air pressure. According to this apparatus, a pressure created by high-pressure water can be applied to the dry film pressed into the cells in their upper part to press the dry film into the cells in their bottom. The apparatus is provided with a plurality of washing nozzles. Rotation of these nozzles at a high speed permits a water stream having a certain width to be ejected. Further, vibration of the nozzles enables a pressure to be applied to the whole surface of the back substrate with the dry film pressed thereinto to press the dry film into the cells in their bottom. This apparatus has high operation reliability because a continuous ejection plunger pump having a maximum ejection pressure of 1500 kgf/cm$^2$ is used as a pressure-producing device instead of a high-pressure booster commonly used in the art. When the temperature of water to be ejected from this apparatus is set at a suitable temperature, the dry film can be softened realizing easy and even pressing of the dry film into the cells in their bottom.

Figure 2C:
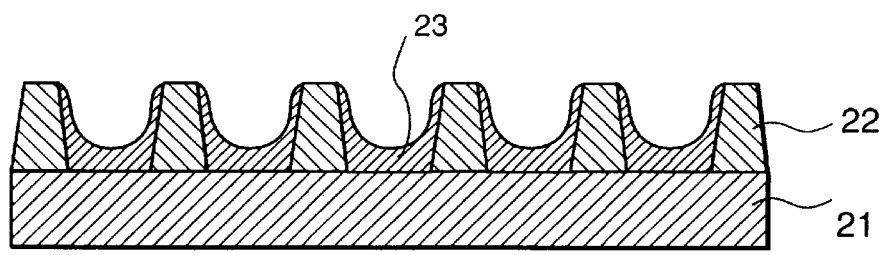
Figure 2D:
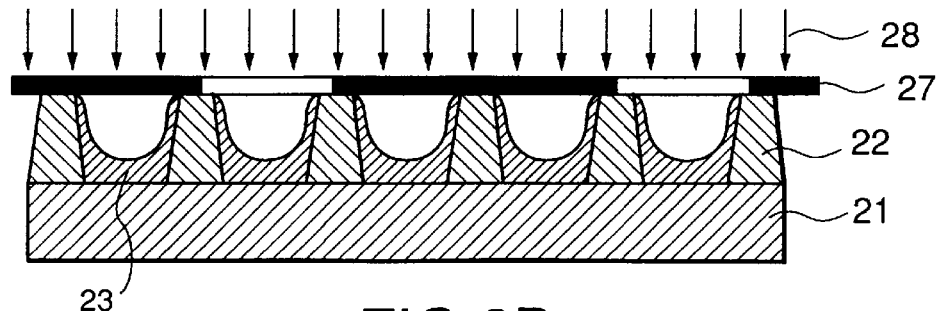
Figure 3A:
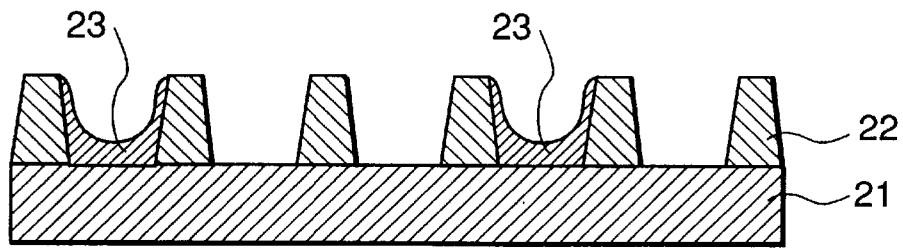
Figure 3B:
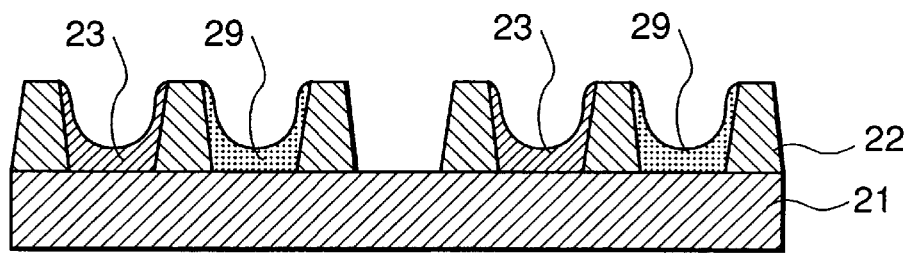

The dry film pressed into the cells in their bottom by the above method is shown in FIG. 2C. After pressing of the dry film into the cells in their bottom, as shown in FIG. 2D, the dry film is exposed through a photomask 27 to light 28 having a suitable wavelength to cure exposed areas of the dry film, followed by treatment with a developing solution. Thus, as shown in FIG. 3A, the dry film can be left within only predetermined cells. When the dry film shown in FIG. 3A contains a red-emitting fluorescent substance, a dry film 29 for green may be then filled into predetermined cells by repeating the steps shown in FIGS. 2A to 3A using a dry film containing a green-emitting fluorescent substance (FIG. 3B). Further, the above procedure may be repeated, except that a dry film 210 containing a blue-emitting fluorescent substance is used instead of the dry film containing a green-emitting fluorescent substance. Thus, as shown in FIG. 3C, dry films for three colors of RGB are pressed into respectively predetermined cells.

Figure 3C:
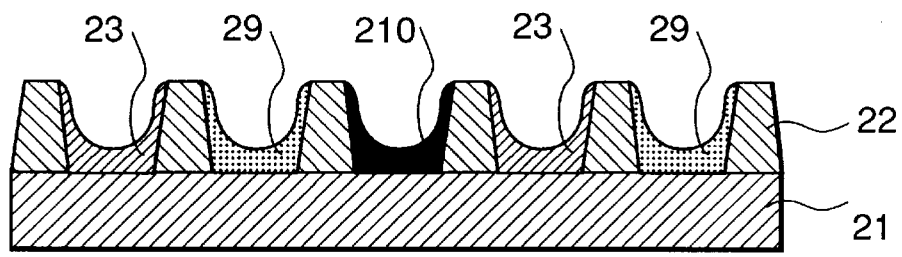
Figure 3D:
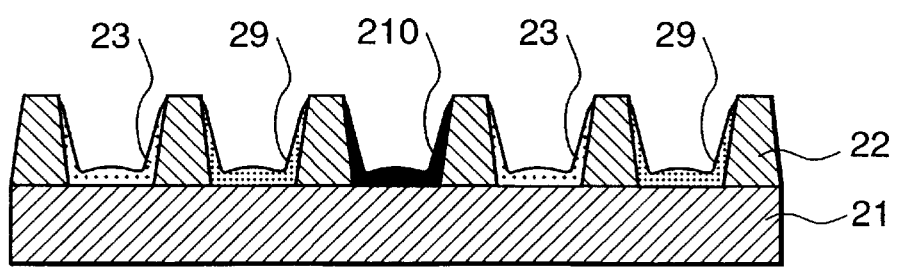
Figure 4:
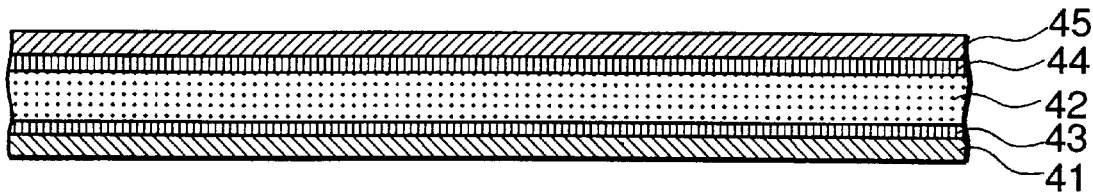
FIG. 4, FIGS. 5A and 5B, and FIG. 17 are cross-sectional views showing dry films according to the present invention.

The assembly shown in FIG. 3C is fired at a suitable temperature to burn off the organic material in the dry film, thereby forming fluorescent substance layers 3,9,10 respectively for emission of three colors, RGB, on the internal surface of the cells.

The fluorescent substance-containing dry film used in the present invention does not have a thickness large enough to fully fill the space of the cells. Therefore, the fluorescent substance content of the dry film may be higher than that of the conventional dry film. For example, the fluorescent substance content is preferably about 60 to 90% by weight based on the dry film.

The dry film may further comprise, in addition to the fluorescent substance and the photosensitive resin, optional additives, such as dyes (coloring type and color former type), adhesion imparting agents, antioxidants, thermal polymerization inhibitors, solvents, surface tension modifiers, stabilizers, chain transfer agents, antifoaming agents, and flame retardants. In particular, incorporation of a silane, aluminum, or titanate coupling agent can improve the adhesion of the fluorescent substance layers finally formed within cells in the back plate of PDP to the surface of the cells. The coupling agent may be previously coated on the surface of the cells in the back plate of PDP.

When the photosensitive resin composition in the dry film used in the present invention is of a dilute alkali developable type, the development after the exposure is carried out using an about 1 to 2 wt % dilute aqueous solution of an alkali, such as sodium carbonate or potassium carbonate.

After the completion of the development, the substrate with cells provided therein is fired at 500 to 550° C. to fix the fluorescent substance within cells. Thus, a fluorescent substance can be fixed on the glass substrate. When the formation of a full-color PDP is contemplated, the steps of transfer, exposure, and firing are repeated for photoresist films respectively containing red-, blue-, and green-emitting fluorescent substances.

Third aspect

The third aspect of the present invention relates to a method for fluorescent substance layer formation in a back plate of PDP and a dry film used in the formation of a fluorescent substance layer.

A substrate 61 and ribs 62 (FIG. 6A) constituting the back plate in the present invention may be formed from conventional materials by conventional methods, and there is no particular limitation on the form thereof.

Figure 5A:
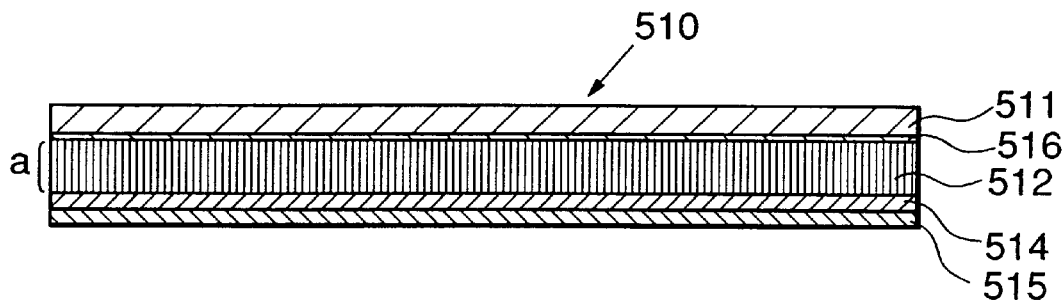

At the outset, the dry film used in the present invention will be described. FIG. 5A is a schematic diagram showing the construction of a dry film 510 used in a preferred embodiment of the present invention, and FIG. 5B a schematic diagram showing the construction of a dry film 510' used in another preferred embodiment of the present invention.

In FIG. 5A, numeral 511 designates a base film, and numeral 512 a photosensitive resin layer. The dry film 510 is substantially free from a fluorescent substance and comprises the flexible photosensitive resin layer 512 laminated onto the base film 511. In the present invention, the thickness a of the photosensitive resin layer is somewhat larger than the depth h of cells with a fluorescent substance layer formed therein (FIG. 6A), that is, large enough to fill up the space on the fluorescent substance-containing layer.

Figure 5B:
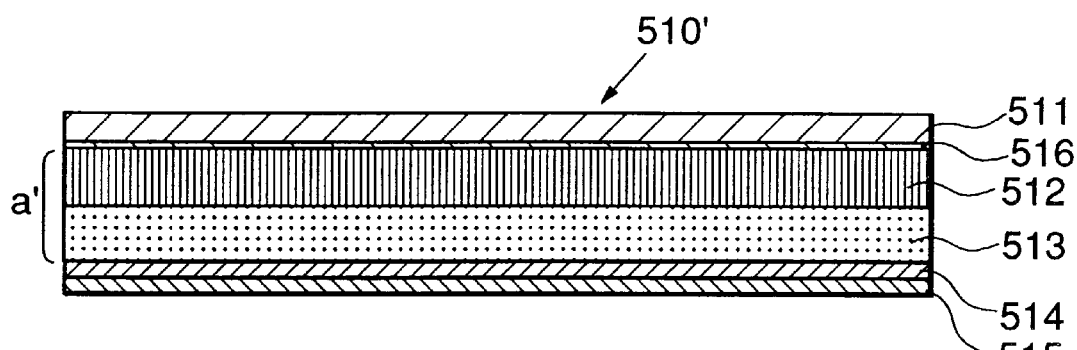
Figure 6A:
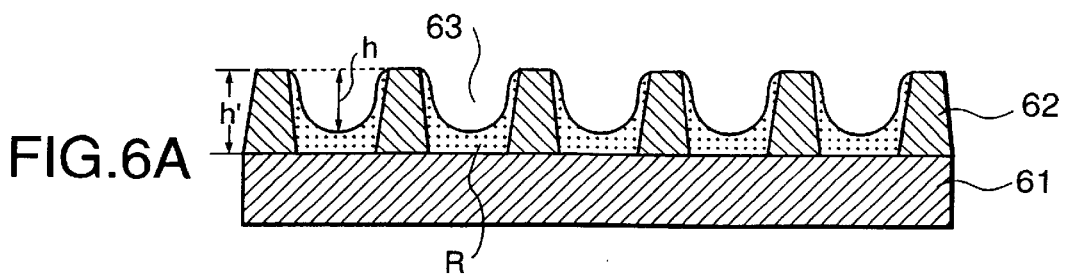

In FIG. 5B, numeral 511 designates a base film, numeral 512 the same photosensitive resin layer as that shown in FIG. 5A, and numeral 513 a fluorescent substance-containing layer. This dry film 510' is substantially free from a fluorescent substance and comprises the base film 511 and, provided on the base film 511, the flexible photosensitive resin layer 512 and the flexible fluorescent substance-containing layer 513 comprising at least a fluorescent substance and a nonphotosensitive resin. In the present invention, the total thickness α' of the photosensitive layer and the fluorescent substance-containing layer is somewhat larger than the cell depth h' (FIG. 6A).

The photosensitive resin layer 512 comprises a photosensitive resin. The photosensitive resin may be any conventional photosensitive resin. One preferred example of the photosensitive resin comprises a base polymer (a), an ethylenically unsaturated compound (b), and a photopolymerization initiator (c). Examples of the base polymer (a) usable herein include acrylic resin, polyester resin, and polyurethane resin. Among them, an acrylic copolymer, which is composed mainly of a (meth)acrylic ester and if necessary has been copolymerized with an ethylenically unsaturated carboxylic acid or other copolymerizable monomer, is important. An acetoacetyl-containing acrylic copolymer may also be used. (Meth)acrylic esters usable herein include methyl (meth)acrylate, ethyl (meth)acrylate, propyl (meth)acrylate, butyl (meth)acrylate, hexyl (meth)acrylate, 2-ethylhexyl (meth)acrylate, cyclohexyl (meth)acrylate, benzyl (meth)acrylate, dimethylaminoethyl (meth)acrylate, hydroxyethyl (meth)acrylate, hydroxypropyl (meth)acrylate, and glycidyl (meth)acrylate.

Preferred ethylenically unsaturated carboxylic acids usable herein include monocarboxylic acids, such as acrylic acid, methacrylic acid, and crotonic acid. In addition, dicarboxylic acids, such as maleic acid, fumaric acid, and itaconic acid, and anhydrides and half esters thereof may also be used. Among them, acrylic acid and methacrylic acid are particularly preferred. When use of the photosensitive resin composition as a dilute alkali developable type is contemplated, copolymerization of about 15 to 30% by weight (about 100 to 200 mg KOH/g in terms of acid value) of the ethylenically unsaturated carboxylic acid is necessary.

Other copolymerizable monomers usable herein include acrylamide, methacrylamide, acrylonitrile, methacrylonitrile, styrene, α-methylstyrene, vinyl acetate, and alkyl vinyl ether.

Ethylenically unsaturated compounds (b) usable herein include polyfunctional monomers such as ethylene glycol di(meth)acrylate, diethylene glycol di(meth)acrylate, tetraethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexane glycol di(meth)acrylate, trimethylolpropane tri(meth)acrylate, glycerin di(meth)acrylate, pentaerythritol di(meth)acrylate, pentaerythritol tri(meth)acrylate, dipentaerythritol penta(meth)acrylate, 2,2-bis(4-(meth)acryloxydiethoxyphenyl)propane, 2,2-bis(4-(meth)acryloxypolyethoxyphenyl)propane, 2-hydroxy-3-(meth)acryloyloxypropyl (meth)acrylate, ethylene glycol diglycidyl ether di(meth)acrylate, diethylene glycol diglycidyl ether di(meth)acrylate, phthalic acid diglycidyl ester di(meth)acrylate, and glycerin polyglycidyl ether poly(meth)acrylate. A suitable amount of a monofunctional monomer may be used together with the polyfunctional monomer.

Examples of monofunctional monomers usable herein include 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, 3-chloro-2-hydroxypropyl (meth)acrylate, glycerin mono(meth)acrylate, 2-(meth)acryloyloxyethyl acid phosphate, half(meth)acrylates of phthalic acid derivatives, and N-methylol (meth)acrylamide.

The amount of the ethylenically unsaturated compound (b) based on 100 parts by weight of the base polymer (a) is preferably 10 to 200 parts by weight, particularly preferably 40 to 100 parts by weight. Use of the ethylenically unsaturated compound (b) in an excessively small amount results in unsatisfactory curing of the photosensitive composition, lowered flexibility of the layer, and delayed development rate of the layer. On the other hand, use of the ethylenically unsaturated compound (b) in an excessively large amount unfavorably results in increased viscosity of the composition, cold flow, and lowered separation rate of the cured resist.

Photopolymerization initiators (c) usable herein include benzoin, benzoin methyl ether, benzoin ethyl ether, benzoin isopropyl ether, benzoin n-butyl ether, benzoin phenyl ether, benzyl diphenyl disulfide, benzyl dimethyl ketal, dibenzyl, diacetyl, anthraquinone, naphthoquinone, 3,3'-dimethyl-4-methoxybenzophenone, benzophenone, p,p'-bis(dimethylamino)benzophenone, p,p'-bis(diethylamino)benzophenone, p,p'-diethylaminobenzophenone, pivalone ethyl ether, 1,1-dichloroacetophenone, p-t-butyldichloroacetophenone, a dimer of hexaarylimidazole, 2,2'-bis(o-chlorophenyl) 4,5,4',5'-tetraphenyl-1,2'-biimidazole, 2-chlorothioxanthone, 2-methylthioxanthone, 2,4-diethylthioxanthone, 2,2'-diethoxyacetophenone, 2,2'-dimethoxy-2-phenylacetophenone, 2,2'-dichloro-4-phenoxyacetophenone, phenyl glyoxylate, α-hydroxyisobutylphenone, dibenzospan, 1-(4-isopropylphenyl)-2-hydroxy-2-methyl-1-propanone, 2-methyl-[4-(methylthio)phenyl]-2-morpholino-1-propanone, tribromophenylsulfone, and tribromomethylphenylsulfone. In this case, the total amount of the photopolymerization initiator (c) incorporated is suitably about 1 to 20 parts by weight based on 100 parts by weight in total of the base polymer (a) and the ethylenically unsaturated compound (b).

If necessary, an organic solvent and the like are added to the photosensitive resin to prepare a photosensitive resin composition which is then coated onto the surface of a base film to a desired thickness on a solid basis. In this case, for example, in the present invention, the photosensitive resin composition is coated at a coverage of about 50 to 200 μm in terms of the thickness on a solid basis to form a photosensitive resin layer. Various additives, for example, dyes (coloring type and color former type), adhesion imparting agents, antioxidants, thermal polymerization inhibitors, solvents, surface tension modifiers, stabilizers, chain transfer agents, and antifoaming agents, may be optionally added to the photosensitive resin composition so far as the layer formed from the composition does not become opaque.

In particular, use of a large amount of an organic or inorganic powder, for example, glass, calcium carbonate, silica, alumina, or silicon carbide, as the additive enables the expensive photosensitive resin to be replaced with the inexpensive powder. This is advantageous from the viewpoint of material cost. This further decreases the resin content of the photosensitive resin layer, leading to lowered tackiness of the dry film. Therefore, the handleability of the dry film is improved, and, in addition, the separability at the time of development is improved. Preferably, the above powder is used in an amount of about 10 to 500 parts by weight based on 100 parts by weight of the photosensitive resin.

In the dry film 510', the same photosensitive resin layer as described above is formed, and a fluorescent substance-containing layer is formed on the surface of the photosensitive resin layer. The fluorescent substance-containing layer comprises a nonphotosensitive resin and a fluorescent substance as indispensable components. Preferably, the nonphotosensitive resin used can be easily fired without leaving any firing residue. This type of nonphotosensitive resins include, for example, cellulosic resins, such as ethyl cellulose, hydroxyethyl cellulose, ethylhydroxy cellulose, hydroxypropyl cellulose, methyl cellulose, cellulose acetate, and cellulose acetate butyrate, vinyl resins, such as polyvinyl alcohol, polyvinyl acetate, polyvinyl butyral, polyvinyl acetal, and polyvinyl pyrrolidone, acrylic resins, such as poly(meth)acrylate and poly(meth)acrylamide, polyurethane resin, polyamide resin, and polyester resin.

Fluorescent substances used in the present invention are not particularly limited. However, preferred are those wherein the matrix is constituted by a rare earth oxyhalide or the like and has been activated by an activator. Examples of ultraviolet excitation type fluorescent substances include: red-emitting fluorescent substances such as $Y_2O_3$:Eu, $YVO_4$:Eu, and $(Y,Gd)BO_3$:Eu; green-emitting fluorescent substances such as $Zn_2GeO_2$:Mn, $BaAl_{12}O_{19}$:Mn, $Zn_2SiO_4$:Mn, and $LaPO_4$:Tb; and blue-emitting fluorescent substances such as $Sr_r(PO_4)_3Cl$:Eu, $BaMgAl_{14}O_{23}$:$Eu^{2+}$, and $BaMgAl_{16}O_{27}$:Eu. Other fluorescent substances usable herein include: red-emitting fluorescent substances such as $Y_2O_3S$:Eu, $\gamma$-$Zn_3(PO_4)_2$:Mn, and $(Zn,Cd)S$:Ag+$In_2O_3$; green-emitting fluorescent substances such as ZnS:Cu, Al, ZnS:Au, Cu, Al, (Zn, Cd)S:Cu, Al, $Zn_2SiO_4$:Mn, As, $Y_3Al_5O_{12}$:Ce, $Gd_2O_2S$:Tb, $Y_3Al_5O_{12}$:Tb, and ZnO:Zn; and blue-emitting fluorescent substances such as ZnS:Ag+red pigment, and $Y_2SiO_3$:Ce. It is a matter of course that these fluorescent substances may be used as a mixture of two or more.

The fluorescent substance-containing layer may be formed by any conventional method without particular limitation. For example, a predetermined amount of the fluorescent substance, other necessary components and the like may be added to the nonphotosensitive resin followed by thorough mixing with stirring to homogeneously disperse the fluorescent substance in the nonphotosensitive resin, thereby preparing a nonphotosensitive resin composition which is then coated on the surface of the photosensitive resin layer to a desired thickness on a solid basis. In this case, for example, in the present invention, the nonphotosensitive resin composition may be coated at a coverage of about 5 to 50 μm in terms of the thickness on a solid basis to form a fluorescent substance-containing layer. In this case, the resin content is preferably 5 to 100 parts by weight, more preferably 10 to 50 parts by weight, based on 100 parts by weight of the fluorescent substance. When the resin content is less than 5 parts by weight, it is difficult to form a dry film. On the other hand, when the resin content exceeds 100 parts by weight, the firing requires a large quantity of thermal energy and in addition evolves a large amount of decomposition gas, rendering the control of the firing oven complicate. Further, the fluorescent substance layer shrinks with the elapse of the firing time, and the finally formed fluorescent substance layer lifts from the cell surface and does not come into intimate contact with the cell surface.

Further, various additives, for example, dyes (coloring type and color former type), adhesion imparting agents, antioxidants, thermal polymerization inhibitors, solvents, surface tension modifiers, stabilizers, chain transfer agents, and antifoaming agents, may be optionally added to the nonphotosensitive resin composition in the present invention. In particular, incorporation of a silane, aluminum, or titanate coupling agent can improve the adhesion of the fluorescent substance layers finally formed within cells in the back plate of PDP to the surface of the cells. The coupling agent may be previously coated on the surface of the cells in the back plate of PDP.

In the fluorescent substance-containing layer 513 in the dry film of the present invention, there is no need to fully fill up the cell space 63 with the fluorescent substance-containing layer alone. Therefore, the fluorescent substance content of the fluorescent substance-containing layer may be higher than that of the conventional dry film. For example, the fluorescent substance content is preferably about 50 to 90% by weight based on the fluorescent substance-containing layer. Further, preferably, three films respectively containing fluorescent substances for emission of three colors, that is, red-, green-, and blue-emitting fluorescent substances are used as the dry film of the present invention.

Thus, the dry films 510 and 510' of the present invention are formed. According to a preferred embodiment of the present invention, a release layer 516 may be provided between the base film 511 and the photosensitive resin layer 512 to facilitate the separation of the photosensitive resin layer 512 and the fluorescent substance-containing layer 513.

Further, in order to facilitate the pressing (transfer) of the photosensitive resin layer 512 and the fluorescent substance-containing layer 513 onto the back substrate of PDP, or in order to impart tackiness at the time of the lamination to the fluorescent substance-containing layer, a plasticizer may be incorporated into the fluorescent substance-containing layer, or alternatively, a pressure-sensitive adhesive layer 514 may be provided on the surface of the fluorescent substance-containing layer 512. Further, in order to improve the storage stability of the dry film 510, a protective film may be applied as a protective layer 515 onto the surface of the fluorescent substance-containing layer 512 or the pressure-sensitive adhesive layer 514. In use, the protective layer 515 is separated, and the photosensitive resin layer 512 and the fluorescent substance-containing layer 513 are transferred onto and pressed into the surface of the back substrate of PDP.

Figure 6B:
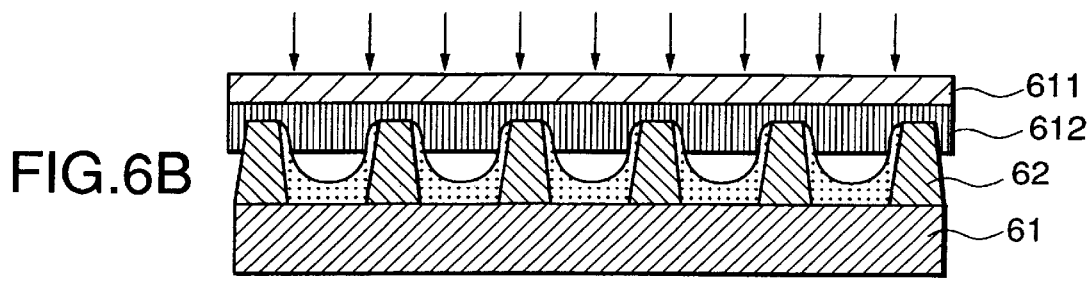
Figure 6C:
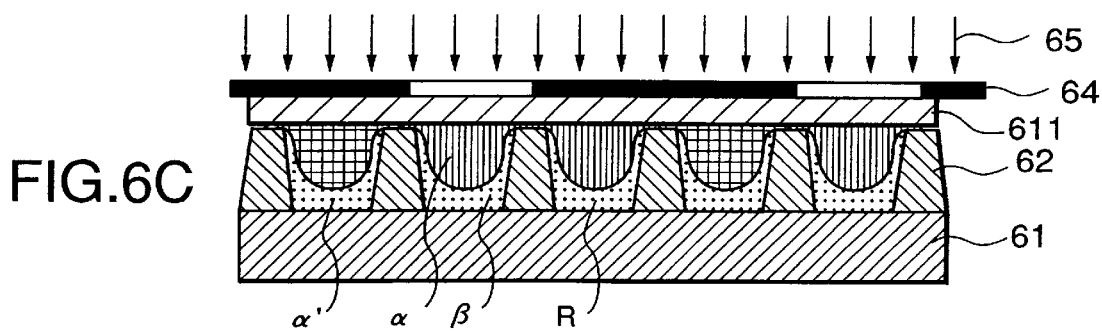
Figure 6D:
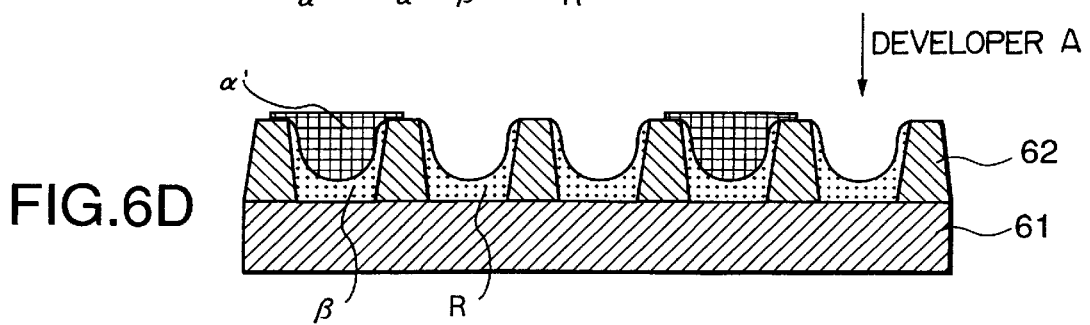

The photosensitive resin layer 512 in the dry film of the present invention should be developable not only before the exposure but also after the exposure. That is, in the embodiment shown in FIGS. 6 to 8, as shown in FIGS. 6C and 6D, the exposed areas should not be developed with a developing solution A, while the nonexposed areas should be developed and removed with the developing solution A. Further, as shown in FIGS. 8B to 8C, the exposed areas also should be developed and removed with a developing solution B. For example, when the photosensitive resin is developable with an alkali, the above developability can be examined using two aqueous developing solutions A and B having different alkalinities. In this case, the fluorescent substance-containing layer should not be removed by development with the developing solutions A and B. For this reason, for example, an alkali-insoluble resin should be used as the nonphotosensitive resin in the fluorescent substance-containing layer. Likewise, when the photosensitive resin is developable with an organic solvent, two organic solvents are used as the developer and the resin in the fluorescent substance-containing layer should not be removed by development with these organic solvents.

The relationship between the photosensitive resin and the developing solution may be summarized as follows.

1. Where the photosensitive resin is of an alkali-developable type:

In FIG. 6C, the alkali developing solution A can develop the photosensitive resin ($\alpha$) in the photosensitive resin layer in its unexposed areas and cannot develop the photosensitive resin ($\alpha'$) in the photosensitive resin layer in its exposed areas and the resin ($\beta$) in the fluorescent substance-containing layer (see FIG. 6D).

Next, reference will be made to FIGS. 8B and 8C. When the developing solution B is used in this step, the developing solution B should have higher alkalinity than the developing solution A. The developing solution B can develop $\alpha'$, but cannot develop $\beta$. The steps shown in FIGS. 8B and 8C are carried out using this developing solution B.

For example, the above relationship may be expressed as follows.

$\alpha$<developing solution A<$\alpha'$<developing solution B<$\beta$ wherein the size of inequality, <, represents that the developing solution has a capability of developing the resin described on the left side of the sign and does not have a capability of developing the resin described on the right side of the sign.

2. Where the photosensitive resin is of an organic solvent developable type:

The relationship between the developing solutions A and B and the photosensitive resins $\alpha$, $\alpha'$, and $\beta$ is the same as described above in connection with the alkali-developable type. Specifically, two organic solvents having such a relationship that the developing capability of the developing solution B is larger than that of the developing solution A are used as the developing solutions, while a resin not removable by development with these organic solvents may be used as the resin in the fluorescent substance-containing layer.

A first preferred embodiment of the method according to the present invention will be described. FIG. 6A is a diagram showing a state after coating a fluorescent substance-containing paste, for a fluorescent substance-containing layer, into portions between a large number of barrier ribs 62 formed on a substrate 61 and drying the coating to form a fluorescent substance-containing layer (for example, a red-emitting fluorescent substance: R) on the side wall and the bottom face of cells defined by the barrier ribs 62. As shown in FIG. 6B, the space above the fluorescent substance-containing layer formed within the cells is filled with a photosensitive resin layer using a dry film as shown in FIG. 5A. In this case, the height of the fluorescent substance-containing layer is preferably about one-fifth to two-third of the height h of the ribs (cell depth). Therefore, preferably, the thickness a of the photosensitive resin layer in the dry film (FIG. 1A) satisfies the relationship: $h-\{(1/5)h$ to $(2/3)h\}$. The filling of the photosensitive resin layer may be carried out, for example, by applying a pressure (and heat) using a pair of rubber rolls or the like.

Figure 6E:
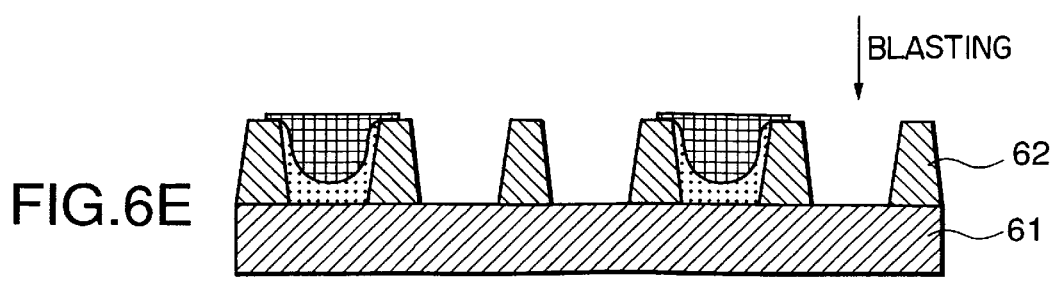
Figure 7A:
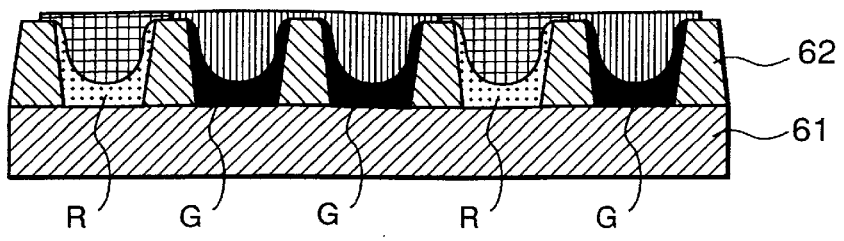
Figure 7B:
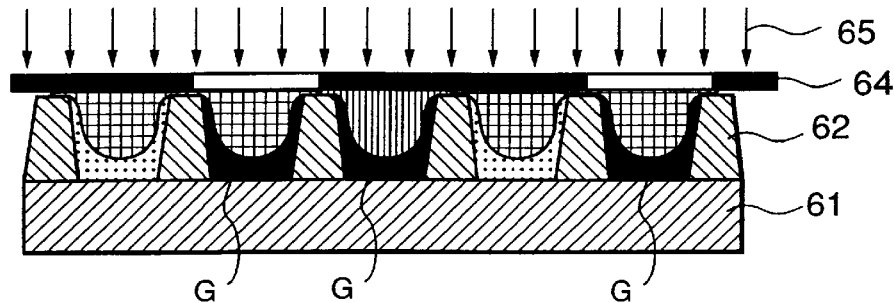
Figure 7B:
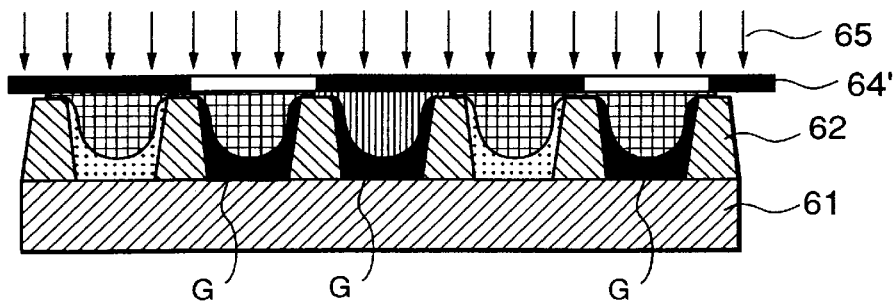
Figure 7C:
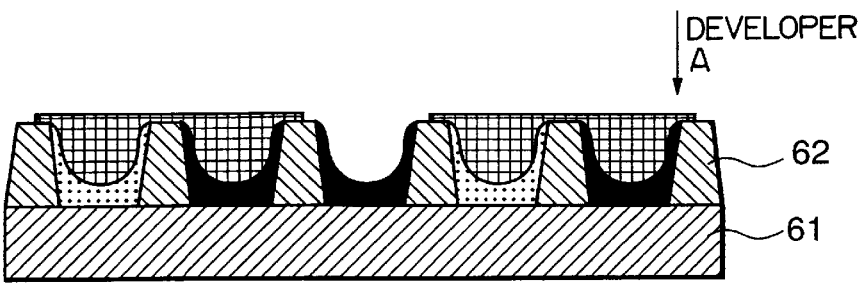
Figure 7D:
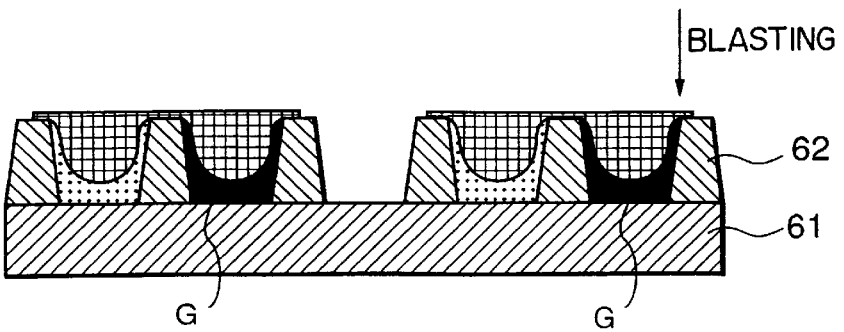

FIG. 6C is a diagram showing pattern exposure in such a state that the fluorescent substance-containing layer and the photosensitive resin layer have been formed within the cells by the above method. Thus, the formation of the fluorescent substance-containing layer and the photosensitive resin layer within the cells followed by exposure to light 65 having a suitable wavelength through a photomask 64 as shown in FIG. 6C permits the photosensitive resin in its exposed areas to be cured. Thereafter, treatment with a suitable developing solution A is carried out to remove the photosensitive resin within predetermined cells as shown in FIG. 6D. Subsequently, the fluorescent substance-containing layer within predetermined cells is removed by a suitable method, such as sand blasting, air blowing, or water jetting (FIG. 6E). In this case, the fluorescent substance-containing layer can be easily removed because it is formed in a fluorescent substance-rich state.

In the removal of the fluorescent substance layer, it should be noted that, since the photosensitive resin $\alpha'$ in its exposed areas has been photocrosslinked and is elastic, the photosensitive resin layer $\alpha'$ in its exposed areas and the underlying fluorescent substance-containing layer are not removed by sandblasting, water jetting or the like. Further, according to a preferred embodiment, the photosensitive resin layer in its nonexposed areas and the fluorescent substance-containing layer can be simultaneously removed by water jetting wherein a liquid, such as water, is ejected at a high pressure. For example, use of the developing solution A as a liquid to be ejected instead of the liquid such as water in the water jetting enables the photosensitive resin layer and the fluorescent substance-containing layer to be simultaneously removed. In this case, as described above, the photosensitive resin layer $\alpha'$ in its exposed areas is not removed by water pressure in water jetting or the developing solution A because it has been photocrosslinked and has ITE elasticity.

When the fluorescent substance-containing layer shown in FIG. 6A contains a red-emitting fluorescent substance R, the 'steps shown in FIGS. 6A to 6E are then repeated using a paste containing a green-emitting fluorescent substance and a dry film 510 shown in FIG. 5A. Specifically, a layer containing a green-emitting fluorescent substance and a photosensitive layer are filled into predetermined cells (FIG. 7A), followed by exposure (FIG. 7B or 7B'), development (FIG. 7C), and sandblasting or the like to remove the photosensitive resin layer in its unexposed areas and the fluorescent substance-containing layer (FIG. 7D).

Figure 8A:
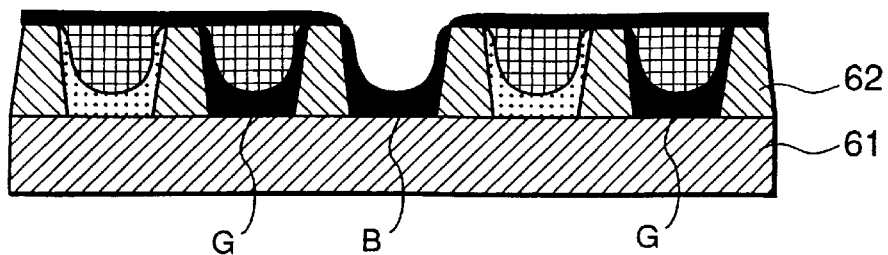
Figure 8B:
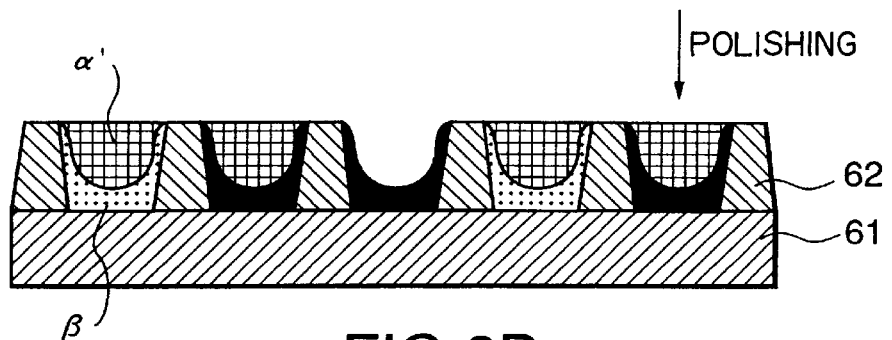
Figure 8C:
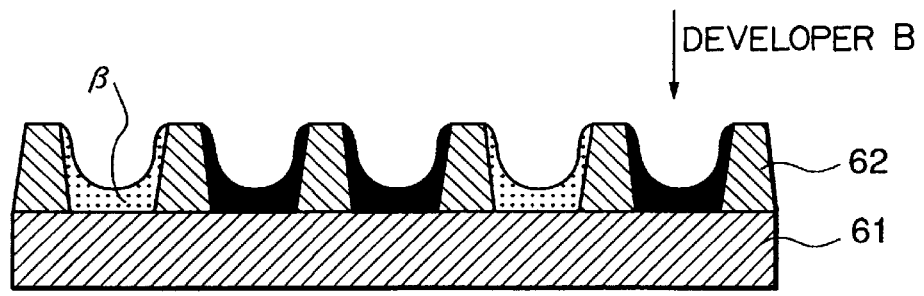
Figure 8D:
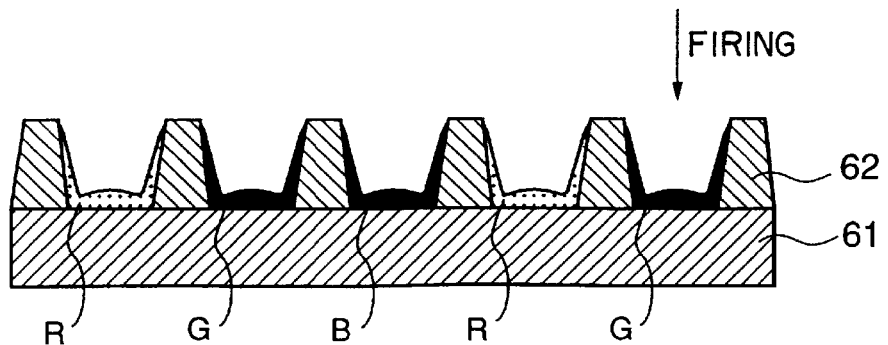

Subsequently, a blue-emitting fluorescent substance paste is filled into predetermined cells to form a blue-emitting fluorescent substance layer B within the predetermined cells (FIG. 8A). In this state, the upper part of the cells is abraded to render the height of the photosensitive resin layer identical to the height of the barrier ribs 2 (FIG. 8B). Treatment with the developing solution B is then carried out to remove the whole photosensitive resin layer in the exposed areas by development (FIG. 8C). After the removal of the whole photosensitive resin layer, if necessary, prebaking is carried out to improve the adhesion between the fluorescent substance-containing layer and the cell surface. The assembly shown in FIG. 8C is then fired at a suitable temperature to burn off the organic material in the fluorescent substance-containing layer, thereby forming fluorescent substance layers respectively for emission of three colors, RGB, on the internal surface of the cells. In the above process, the number of times of repetition of pattern exposure is only 2, and, unlike the prior art technique, repetition of pattern exposure three times is not required.

Figure 9A:
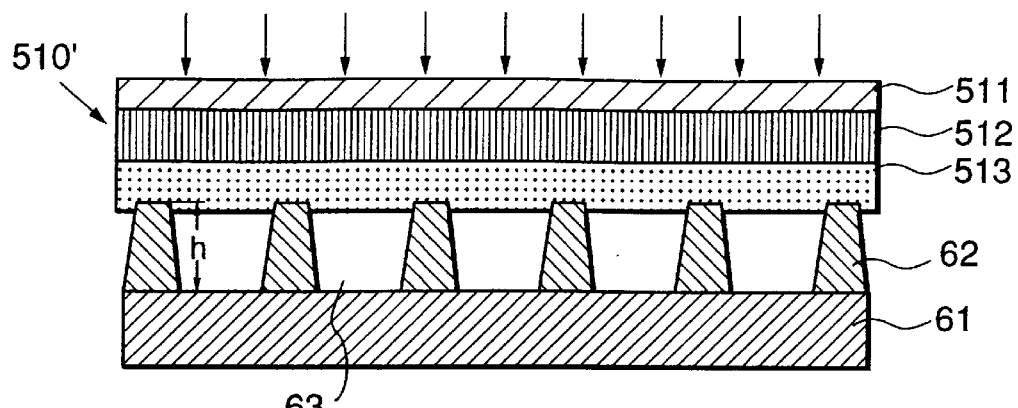
Figure 9B:
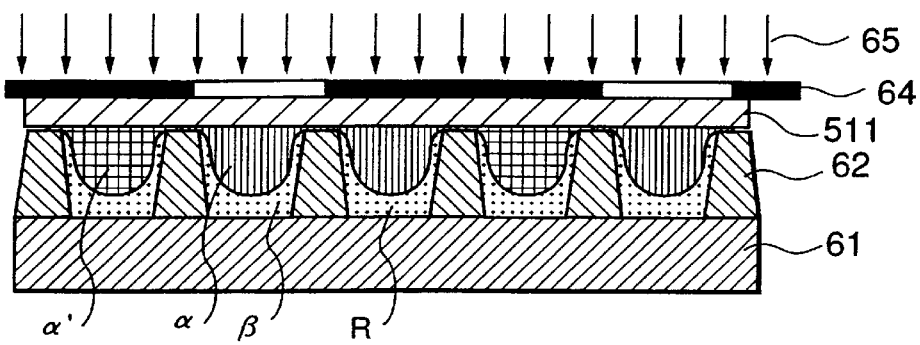
Figure 9C:
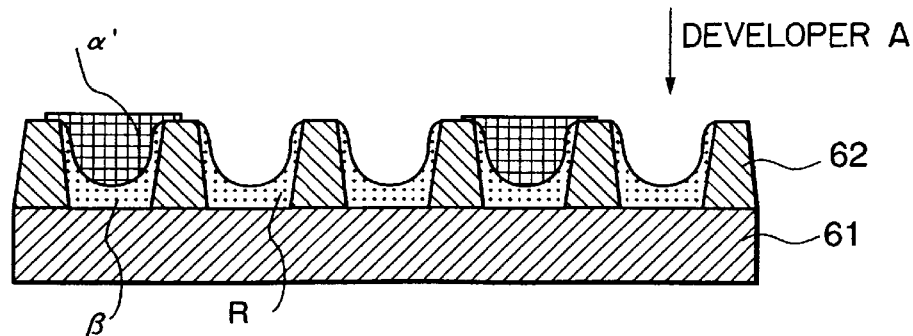
Figure 9D:
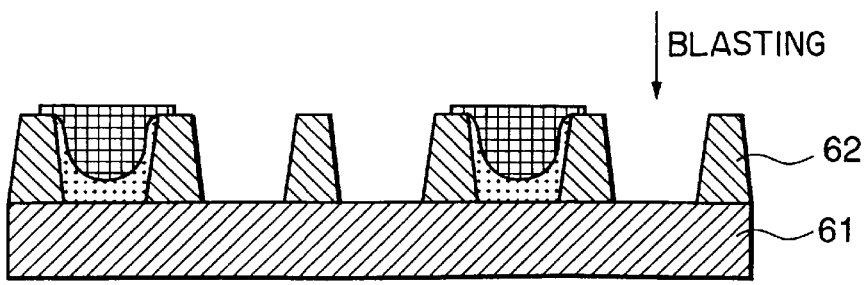

Next, a second preferred embodiment of the present invention, wherein a dry film 510' shown in FIG. 5B is used, will be described with reference to FIGS. 9 to 11. At the outset, the dry film 510' is disposed so as to face a glass substrate, a suitable pressure is applied to the dry film to fill the fluorescent substance-containing layer and the photosensitive resin layer into portions between barrier ribs (FIG. 9A), followed by the procedure described above, that is, pattern exposure (FIG. 9B), removal of the photosensitive resin in nonexposed areas by development (FIG. 9C) with the developing solution A, and removal of the fluorescent substance-containing layer in exposed areas (FIG. 9D). As with the first preferred embodiment, in this preferred embodiment, the photosensitive resin and the fluorescent substance-containing layer may be simultaneously removed.

Figure 10A:
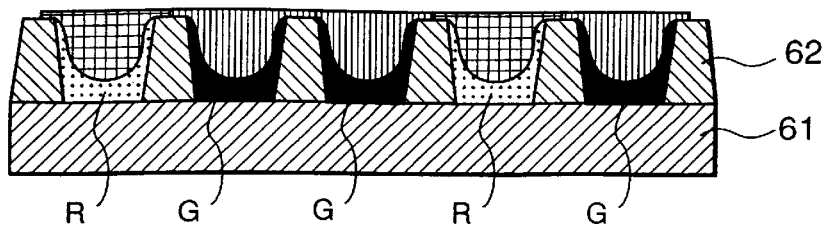
Figure 10B:
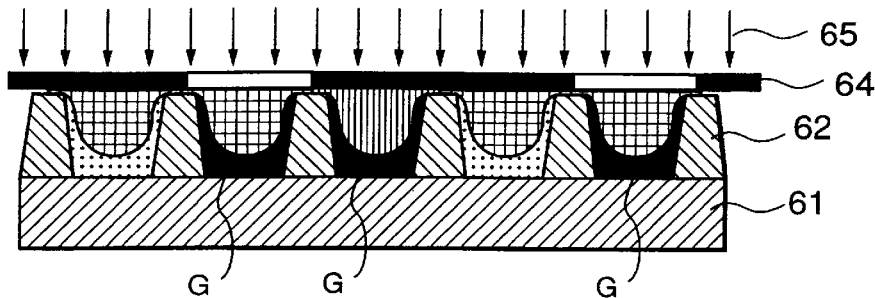
Figure 10B:
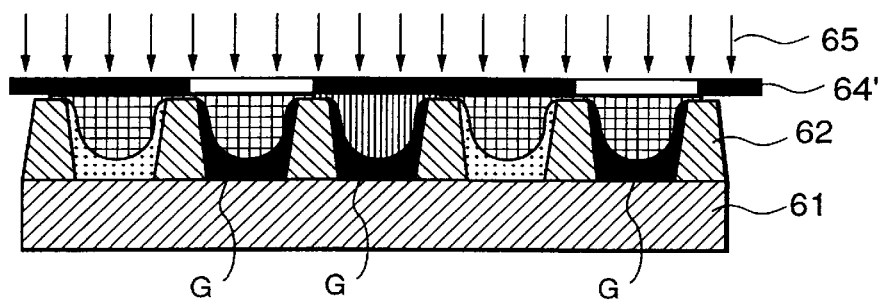
Figure 10C:
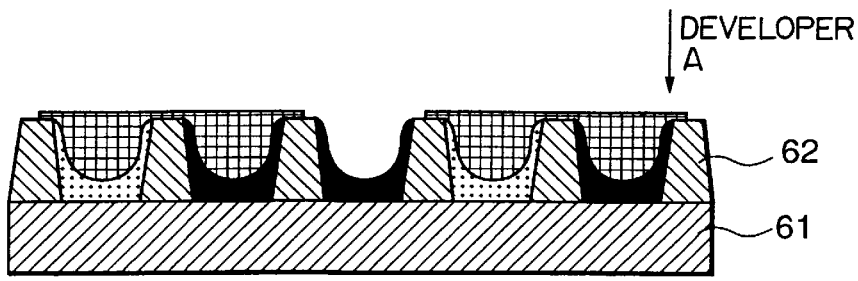
Figure 10D:
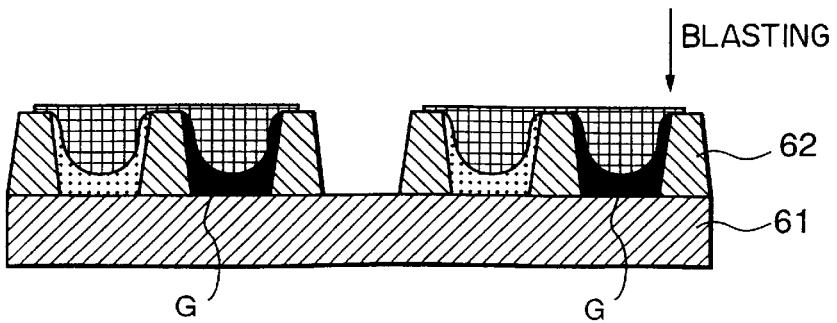
Figure 11A:
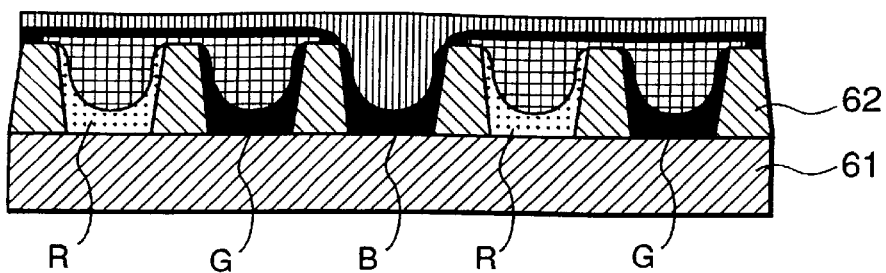
Figure 11B:
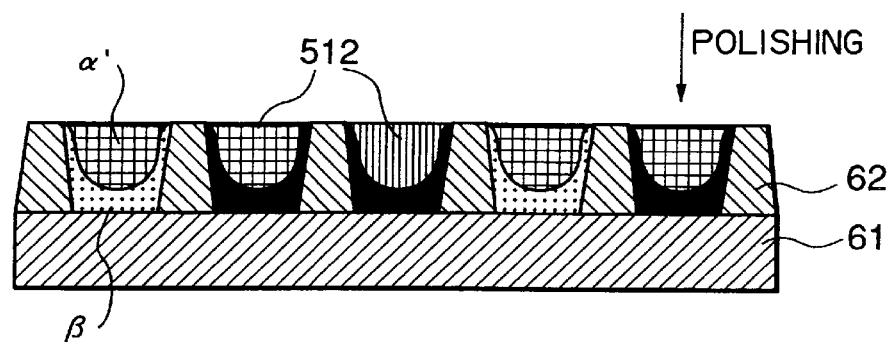
Figure 11C:
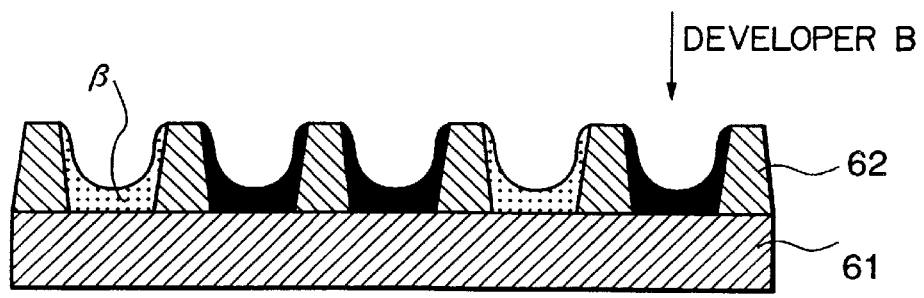
Figure 11D:
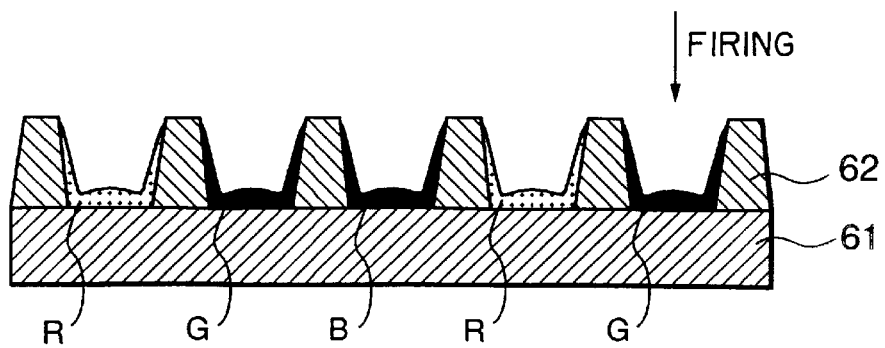

A fluorescent substance-containing layer and a photosensitive layer are filled into predetermined cells in the same manner as described above, except that a dry film 510' containing a green-emitting fluorescent substance is used (FIG. 10A). Thereafter, in the same manner as in the first preferred embodiment, exposure is carried out (FIG. 10B or 10B'), and the photosensitive resin in nonexposed areas and the fluorescent substance-containing layer are removed (FIGS. 10C and 10D). A fluorescent substance-containing layer and a photosensitive layer are filled into predetermined cells in the same manner as described above, except that a dry film 510' containing a blue-emitting fluorescent substance is used (FIG. 11A). Thereafter, in the same manner as in the first preferred embodiment, the surface is abraded (FIG. 11B), the photosensitive resin layer is entirely removed with the developing solution B, and the procedure of the first preferred embodiment is repeated to carry out prebaking and firing. As a result, the organic material in the fluorescent substance-containing layer is burned off, thereby forming fluorescent substance layers respectively for emission of three colors, RGB, on the internal surface of the cells.

In the above process, the number of times of repetition of pattern exposure is only 2, and, unlike the prior art technique, repetition of pattern exposure three times is not required. There is no need to expose the photosensitive resin layer on the finally filled layer containing a blue-emitting fluorescent substance (FIG. 11A). If necessary for abrading, whole exposure, pattern exposure, heat curing or the like may be carried out.

When the photosensitive resin layer in the dry film used in the present invention is of a dilute alkali developable type, the development after the exposure is carried out using an about 0.2 to 2 wt % dilute aqueous solution of an alkali, such as caustic soda, sodium carbonate, or potassium carbonate. After the completion of the development, the substrate with cells provided therein is fired at 500 to 550° C. to fix the fluorescent substance layer within cells.

Fourth aspect

The fourth aspect of the present invention relates to a method for fluorescent substance layer formation in a back plate of PDP. The method of the present invention is diagrammatically shown in FIGS. 12 to 15.

Figure 12A:
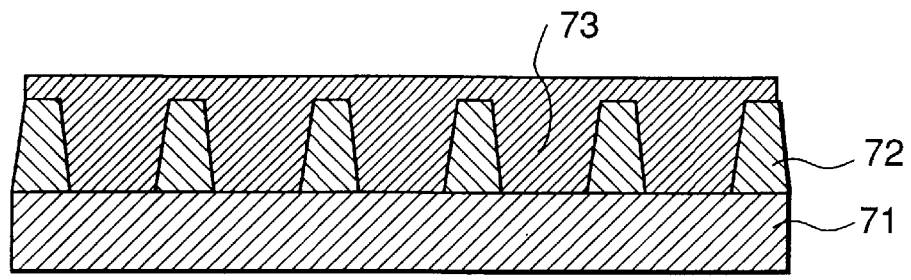

FIG. 12A is a diagram showing a state after filling a positive-working photosensitive composition 73 into portions between a large number of barrier ribs 72 formed on a substrate 71. The substrate 71 and the ribs 72 may be formed from conventional materials by conventional methods, and there is no particular limitation on the form thereof.

The positive-working photosensitive resin 73 to be filled into between the barrier ribs 72 may be in the form of a flexible film, a paste, and any other form. For example, when in the case of a film of the photosensitive resin, the photosensitive resin film may be put on the barrier ribs 72, followed by application of a pressure to the film to press the film into between the ribs 72. On the other hand, when a solvent-containing paste of the positive-working photosensitive resin is used, filling of the paste into between the barrier ribs followed by drying causes the solvent to be evaporated, resulting in uneven surface of the filled resin layer. Therefore, the surface of the portions between barrier ribs are likely to be recessed. This, however, poses no problem if the bottom of the recess is located above the top of the barrier ribs. That is, that the surface of the filled and dried positive-working photosensitive resin is flat and smooth is not indispensable.

The positive-working photosensitive resin per se may be any convectional one, and positive-working photosensitive resins usable herein include conventional positive-working photosensitive resins, for example, novolak resins, polymethyl vinyl ketone, polyvinyl phenyl ketone, polysulfone, diazonium salts, such as p-diazodiphenylamine/p-formaldehyde condensate, quinonediazides, such as 1,2-naphthoquinone-2-diazido-5-sulfonic acid isobutyl ester, polymethyl methacrylate, polyphenylmethylsilane, and polymethyl isopropenyl ketone. Commercially available positive photosensitive resins include, for example, NPR 9100 (manufactured by Nagase Denshi Kagaku) and OFPR 800 (manufactured by Tokyo Ohka Kogyo Co., Ltd.), both of which may be used in the present invention.

Figure 12B:
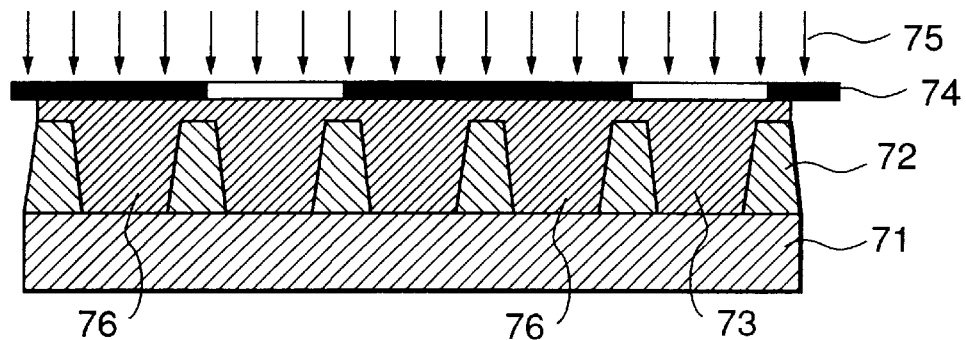
Figure 12C:
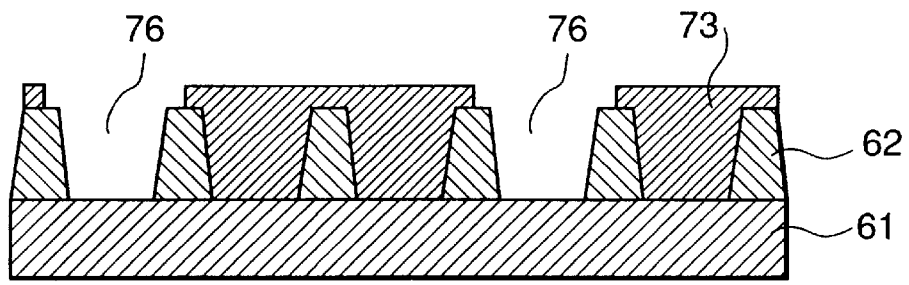
Figure 12D:
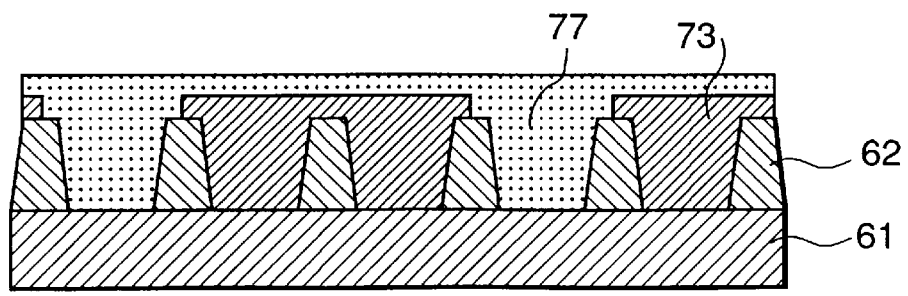

FIG. 12B is a diagrams showing exposure of the photosensitive resin 73 filled into between the barrier ribs 72 to light 75 having a suitable wavelength through a photomask 74 in a predetermined form. This exposure renders exposed areas 76 soluble in a developing solution, and development with a suitable developing solution creates spaces 76 between predetermined barrier ribs as shown in FIG. 12C. FIG. 12D is a diagram showing a state after filling of a fluorescent substance composition 77 (for example, in a coating, paste, or film form) into the spaces 76 formed above (the drawing shows an example of the red-emitting fluorescent substance).

Figure 13A:
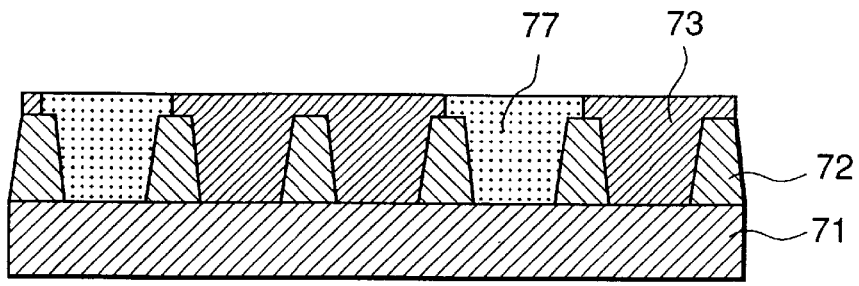
Figure 13B:
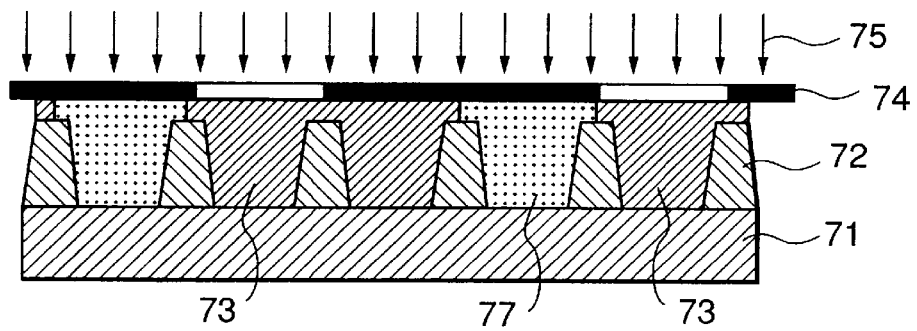
Figure 13C:
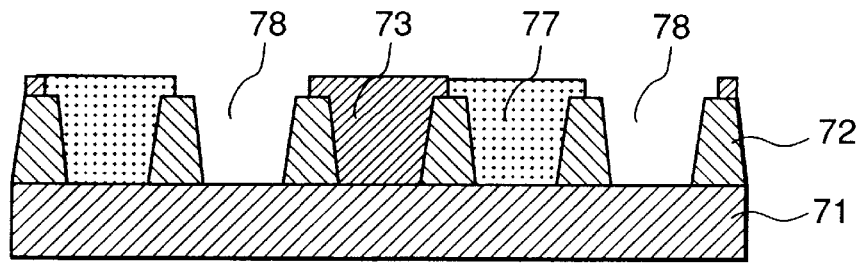
Figure 13D:
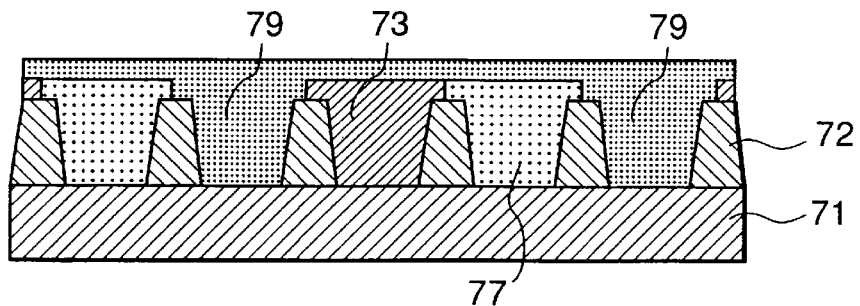

As shown in FIG. 13A, if necessary, the surface is then abraded to smoothen the whole surface. This step is not indispensable. Subsequently, as shown in FIG. 13B, the photosensitive resin layer 73 is exposed through a photomask 74 in the same manner as described above. The photosensitive resin layer 73 in its exposed areas are developed in the same manner as described above to form areas 78, as shown in FIG. 13C, where a green-emitting fluorescent substance layer is to be formed. A green-emitting fluorescent substance composition 79 is filled into the developed areas 78 (FIG. 13D).

Figure 14A:
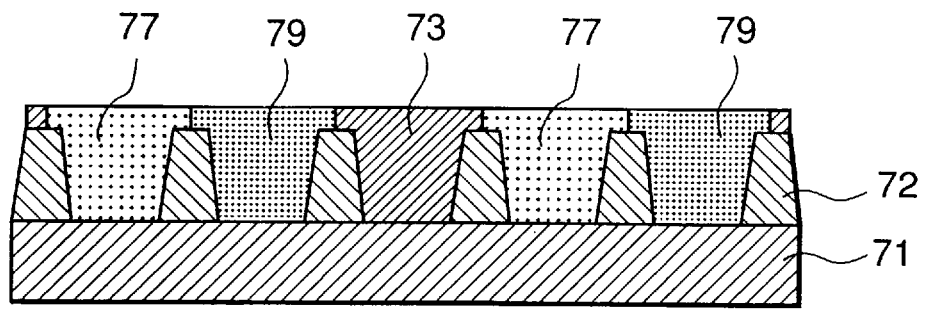
Figure 14B:
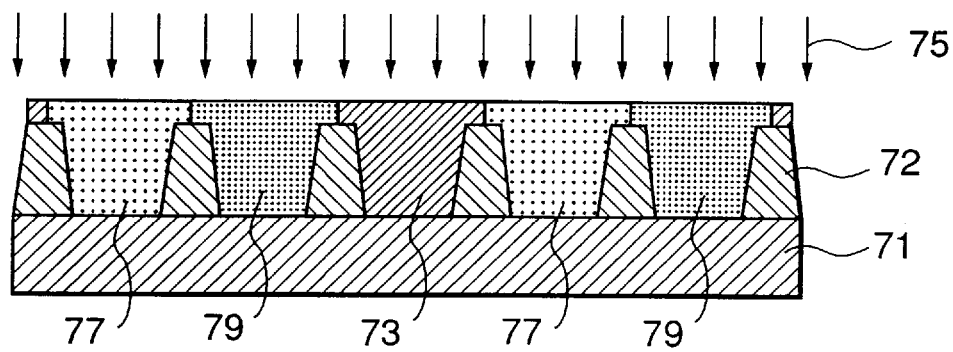
Figure 14C:
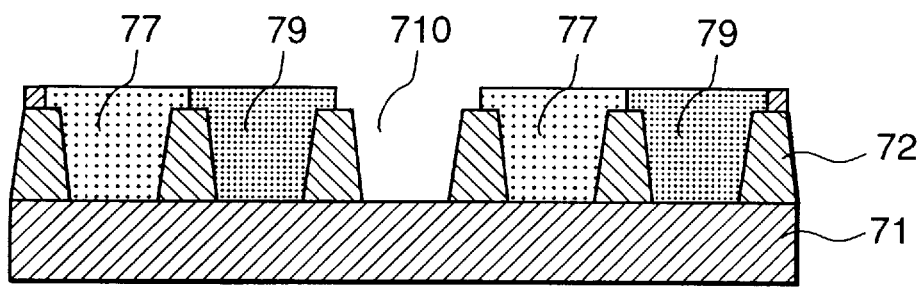
Figure 14D:
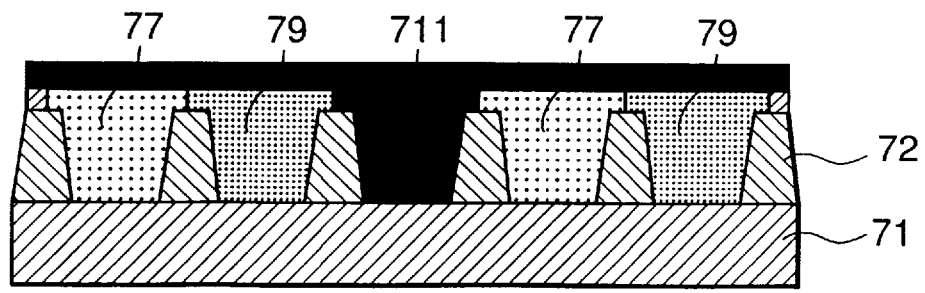
Figure 15A:
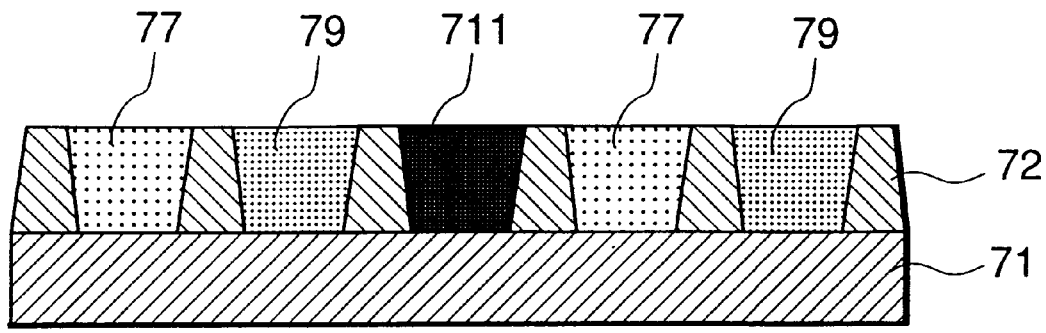

Further, as shown in FIG. 14A, if necessary, the surface is smoothened. Whole exposure is carried out without need to provide any photomask, and this renders the remaining photosensitive resin 73 developable. Removal of the photosensitive resin by the development is then carried out in the same manner as described above to form an area 10 where a blue-emitting fluorescent substance layer is to be formed (FIG. 14C), followed by filling of a blue-emitting fluorescent substance composition 711 into the area (space). Thereafter, as shown in FIG. 15A, preferably, the whole surface is abraded until the surface reaches the top of the barrier ribs 73, thereby rendering the height of the large number of barrier ribs even to improve the adhesion of the back plate to the front plate in the finally formed PDP.

Figure 15B:
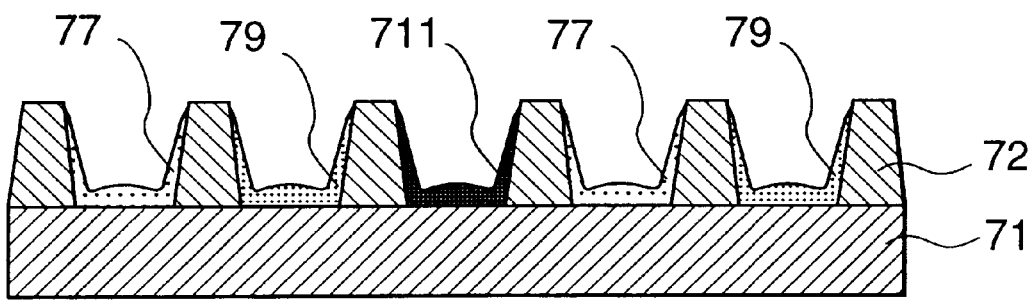
Figure 16A:
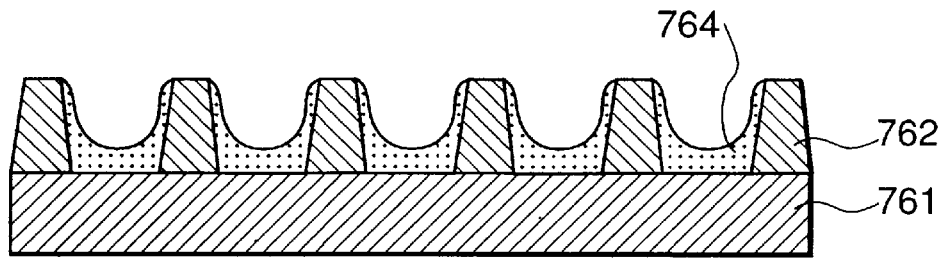
FIG. 16 is a cross-sectional view showing the steps in a conventional process for producing a back plate of a plasma display panel.
Figure 16B:
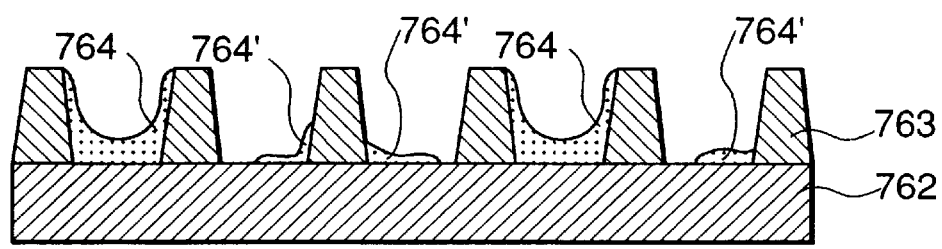
Figure 16C:
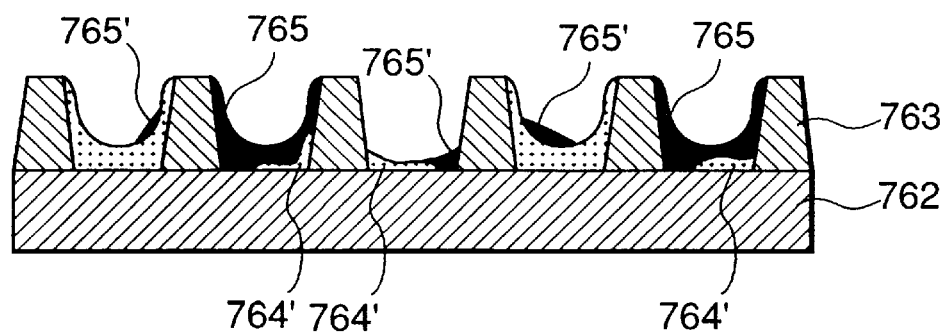

After the red-, green-, and blue-emitting fluorescent substance compositions 77, 79, 711 are filled into respective predetermined portions between the barrier ribs 72, the whole assembly is fired to decompose and remove the organic material in the composition. Thus, as shown in FIG. 15B, fluorescent substance layers 77, 79, and 711 are formed on the surface of cells defined by the barrier ribs 72 and the substrate 73 (in FIGS. 12 to 15, address electrodes are omitted).

As shown in the drawing, preferably, the positive-working photosensitive resin and/or the fluorescent substance composition used in the present invention are filled into between the ribs to a thickness exceeding the height of the ribs. When the surface of the positive-working photosensitive resin and/or the fluorescent substance composition filled into between the ribs is located below the top of the ribs, filling of a fluorescent substance composition for a second color after the formation of a fluorescent substance layer for a first color causes the fluorescent substance composition, for the second color, to be filled also on the fluorescent substance composition layer for the first color. The fluorescent substance composition for the second color filled on the fluorescent substance composition layer for the first color cannot be removed, and mixing of fluorescent substances occurs after final firing. On the other hand, as described above, when the positive-working photosensitive resin and the fluorescent substance composition are filled into between the ribs to a thickness exceeding the height of the ribs as shown in the drawing, there is no mixing of fluorescent substances. In this case, even though somewhat mixing occurs on the filling layer, as shown in FIG. 14A, abrading of the whole surface permits the mixed portion of the fluorescent substance composition to be fully removed, preventing mixing of the final fluorescent substances.

Further, according to the method of the present invention, the top of the ribs can be easily abraded. Specifically, in the preparation of PDP, the barrier ribs provided on the back plate should have even height. For this reason, the top of the ribs has hitherto been abraded in the longitudinal direction of the ribs by means of an expensive abrasive tape. When the ribs are abraded by polishing, the abrading force is applied also from the lateral direction. Therefore, in the case of the abrading by polishing, polishing has been carried out with a material filled into between the ribs. On the other hand, in the present invention, as shown in FIG. 15A, the fluorescent substance composition fills up the portions between the ribs, offering an advantage that the ribs are not broken by abrading by polishing in the lateral direction.

Thus, the positive-working photosensitive resin used in the present invention is a resin which has hitherto been commonly used in various fields. Therefore, it is relatively inexpensive. When a further reduction in cost is desired, a filler not detrimental to the photosensitivity of the positive-working photosensitive resin may be added to the resin. Fillers usable herein include plastic pigments, such as polyethylene, polypropylene, and polymethyl methacrylate, and relatively transparent extender pigments, for example, glass materials, such as fine glass beads and glass powders, silica, alumina, and calcium carbonate. The amount of the filler added to the positive-working photosensitive resin is 1 to 90 parts by weight, preferably 5 to 80 parts by weight, based on 10 parts by weight of the photosensitive resin. The fluorescent substance composition for the fluorescent substance layer, unlike that in the prior art, is not filled into portions between other barrier ribs than predetermined. Therefore, mixing of the fluorescent substance with other fluorescent substance(s) does not occur. Further, since the fluorescent substance is not removed by the development, substantially the whole amount of the fluorescent substance used can be effectively utilized, rendering the present invention very cost-effective.

In the case of the fluorescent substance composition used in the present invention, the layer formed by the composition is not required to be patterned by exposure and development. Therefore, although the composition may be photosensitive, this is not indispensable.

Fluorescent substances used in the present invention are not particularly limited. However, preferred are those wherein the matrix is constituted by a rare earth oxyhalide or the like and has been activated by an activator. Examples of ultraviolet excitation type fluorescent substances include: red-emitting fluorescent substances such as $Y_2O_3$:Eu, $YVO_4$:Eu, and $(Y,Gd)BO_3$:Eu; green-emitting fluorescent substances such as $Zn_2GeO_2$:Mn, $BaAl_{12}O_{19}$:Mn, $Zn_2SiO_4$:Mn, and $LaPO_4$:Tb; and blue-emitting fluorescent substances such as $Sr_5(PO_4)_3Cl$:Eu, $BaMgAl_{14}O_{23}$:Eu$^2$, and $BaMgAl_{16}O_{27}$:Eu. Other fluorescent substances usable herein include: red-emitting fluorescent substances such as $Y_2O_3$:Eu, $\gamma$-$Zn_3(PO_4)_2$:Mn, and $(Zn,Cd)S$:Ag+$In_2O_3$; green-emitting fluorescent substances such as ZnS:Cu, Al, ZnS:Au, Cu, Al, (Zn, Cd)S:Cu, Al, $Zn_2SiO_4$:Mn, As, $Y_3Al_5O_{12}$:Ce, $Gd_2O_2S$:Tb, $Y_3Al_5O_{12}$:Tb, and ZnO:Zn; and blue-emitting fluorescent substances such as ZnS:Ag+red pigment, and $Y_2SiO_3$:Ce. It is a matter of course that these fluorescent substances may be used as a mixture of two or more.

The fluorescent substance composition used in the present invention may be used in the form of a paste prepared by bringing the fluorescent substance to a paste with the aid of a resin binder and a miner amount of a solvent or a sheet or a film prepared by mixing and milling the fluorescent substance with a thermoplastic resin and forming the mixture into a sheet or a film. The resin binder may be either a photosensitive resin binder or a nonreactive resin binder.

The photosensitive resin used in the present invention comprises a base polymer (a), an ethylenically unsaturated compound (b), and a photopolymerization initiator (c). Examples of the base polymer (a) usable herein include acrylic resin, polyester resin, and polyurethane resin. Among them, an acrylic copolymer, which is composed mainly of a (meth)acrylic ester and if necessary has been copolymerized with an ethylenically unsaturated carboxylic acid or other copolymerizable monomer, is important. An acetoacetyl-containing acrylic copolymer may also be used.

Nonreactive resins are preferably those which are easily heat-decomposed upon firing, and examples thereof include cellulosic resins, such as ethyl cellulose, methyl cellulose, nitrocellulose, acetyl cellulose, acetylethyl cellulose, cellulose propionate, hydroxypropyl cellulose, butyl cellulose, benzyl cellulose, and nitrocellulose, and acrylic resins of polymers or copolymers of methyl methacrylate, ethyl methacrylate, n-butyl methacrylate, isobutyl methacrylate, isopropyl methacrylate, 2-ethyl methacrylate, or 2-hydorxyethyl methacrylate. The amount of the resin binder used may be the same as described above in connection with the photosensitive resin.

The fluorescent substance, the organic solvent, and other optional components may be incorporated into the photosensitive resin or the nonreactive resin by any method without limitation, and examples of methods usable herein include conventional methods, for example, a method wherein a predetermined amount of a fluorescent substance and the like are added to the resin binder followed by thorough mixing with stirring to homogeneously disperse the fluorescent substance. In this case, the fluorescent substance content is preferably 1 to 5 parts by weight, more preferably 2 to 8 parts by weight, based on 10 parts by weight of the resin binder. When the fluorescent substance content exceeds 10 parts by weight, the thickness of the fluorescent substance layer present between the ribs after firing is so large that the discharge space is excessively small. On the other hand, a fluorescent substance content of less than 1 parts by weight is unfavorable because the brightness of the resultant fluorescent substance layer is likely to lower.

Figure 17:
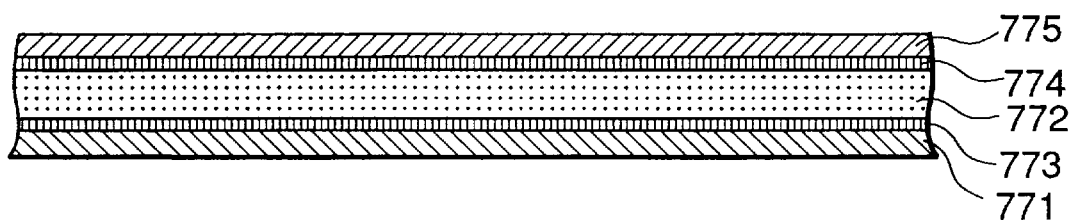

The positive-working photosensitive resin composition with the filler added thereto may be used, for example, as a paste or alternatively as a dry film. In the case of the dry film, for example, as diagrammatically shown in FIG. 17 (a cross-sectional view), polyethylene terephthalate, polyethylene, polypropylene or the like is provided as a base film 771, and a coating liquid comprising the positive-working photosensitive resin composition is coated onto the base film to a suitable thickness (on a dry basis), followed by drying of the coating to from a photosensitive resin layer 772. According to a preferred embodiment, a release layer 773 may be provided between the base film 771 and the resin layer 772 to facilitate the separation of the resin layer 772. Further, a pressure-sensitive adhesive layer 774 may be provided on the surface of the resin layer 772 from the viewpoint of facilitating the transfer of the resin layer onto the back substrate of PDP. Further, in order to improve the storage stability of the dry film, the same film as the base film may be applied as a protective layer 775 onto the surface of the resin layer 772 or the pressure-sensitive adhesive layer 774. In use, the protective layer 775 is separated, and the resin layer 772 is transferred onto the surface of the back substrate of PDP.

Further, various additives, for example, dyes (coloring type and color former type), adhesion imparting agents, antioxidants, thermal polymerization inhibitors, solvents, surface tension modifiers, stabilizers, chain transfer agents, antifoaming agents, and flame retardants may be added to the fluorescent substance composition and the fluorescent substance dry film in the present invention. In particular, incorporation of a silane, aluminum, or titanate coupling agent can improve the adhesion of the fluorescent substance layers finally formed within cells in the back plate of PDP to the surface of the cells. The coupling agent may be previously coated on the surface of the cells in the back plate of PDP.

EXAMPLES

The present invention will be described in more detail with reference to the following examples. In the examples, "%" or "parts" are by weight unless otherwise specified.

Example A1
Preparation of photosensitive resin composition 23 parts of the following base polymer, 27 parts of the following ethylenically unsaturated compound, 4 parts of the ;following photopolymerization initiator, 26 parts of the following fluorescent substance, and 57 parts of the following volatile organic material were mixed together to prepare a photosensitive resin composition.

(Base polymer)
A copolymer (acid value 143.3, glass transition point 66.3° C., weight average molecular weight 80,000) of methyl methacrylate/n-butyl methacrylate/2-ethylhexyl acrylate/methacrylic acid in a weight ratio of 55/8/15/22.

(Ethylenically unsaturated compound)
A mixture of trimethylolpropane triacrylate/polyethylene glycol (600) dimethacrylate/ethylene oxide-modified phthalic acid acrylate (manufactured by Kyoeisha Chemical Co., Ltd.) in a weight ratio of 20/10/6.

(Photopolymerization initiator)
A mixture of benzophenone/p,p'-diethylaminobenzophenone/2,2-bis(o-chlorophenyl)-4,5,4',5'-tetraphenyl-1,2'-biimidazole in a comonomer weight ratio of 8/0.15/1.

(Fluorescent substance)
A mixture of $(Y, Gd)BO_3$: $Eu/Zn_2SiO_4$:$Mn$/$BaMgAl_{14}O_{23}$: $Eu^{2+}$=33/50/17 (weight ratio) (average particle diameter: 4±2 μm)

(Volatile organic material)
Dioctyl phthalate (boiling point: 390° C. at 760 mmHg, 225–230° C. at 4 mmHg)

Preparation of dry film
The above photosensitive composition was coated onto a 20 μm-thick polyester film by means of an applicator (gap 4 mil), and the coating was allowed to stand at room temperature for 1.5 min and dried in an oven of 60° C., 90° C., and 110° C. each for 3 min, thereby forming a 20 μm-thick dry film of the present invention. In this dry film, no protective film was provided.

Lamination onto glass substrate
The dry film was laminated onto a glass substrate (an ITO film substrate having thereon an about 0.1 to 0.2 μm-thick conductive circuit, 200 mm×200 mm×2 mm), which had been preheated at 60° C. in an oven, under conditions of a laminating roll temperature of 100° C., a laminating roll pressure of 3 kg/cm², and a lamination rate of 1.5 m/sec.

Exposure and development
After the lamination, a pattern mask was put on top of the surface of the resist so that exposed areas having a size of 200 μm square at a pitch of 260 μm in the vertical and horizontal directions are formed on the whole surface of the laminate, followed by exposure at 40 mJ of light from a 3 kw ultrahigh pressure mercury lamp by means of an exposing machine HMW-532D manufactured by Orc Manufacturing Corporation. After the exposure, a hold time of 15 min was provided, the polyester film was separated and removed, and development was carried out at 20° C. using a 1% aqueous sodium carbonate solution for a period of time which was 1.5 times longer than the minimum development time.

Drying
After the development, the whole assembly was dried in a drying oven of 250° C. and 4 mmHg for 10 min, thereby evaporating and removing dioctyl phthalate contained in the resist film.

(Firing)
After the drying, the temperature of the assembly was raised from room temperature to 550° C. over a period of one hr to burn off the resin component within the resin film, thereby forming a fluorescent substance layer.

Example A2 to A7

Photosensitive resin compositions were prepared in the same manner as in Example A1, except that the content of the components constituting the photosensitive composition and the kind and content of the volatile organic material in Example A1 were varied as indicated in Table A1. Photoresist films were prepared in the same manner as in Example A1, except that the photosensitive resin compositions prepared just above were used.

TABLE A1

| Ex. | Base polymer | Ethylenically unsaturated compound | Photopolymerization initiator | Fluorescent substance | Volatile organic material |
| --- | --- | --- | --- | --- | --- |
| A2 | Same as Ex. A1 (46 parts) | Same as Ex. A1 (54 parts) | Same as Ex. A1 (8 parts) | Same as Ex. A1 (30 parts) | Dioctyl phthalate (5 parts) |

TABLE A1-continued

| Ex. | Base polymer | Ethylenically unsaturated compound | Photopolymerization initiator | Fluorescent substance | Volatile organic material |
|---|---|---|---|---|---|
| A3 | Same as Ex. A1 (46 parts) | Same as Ex. A1 (54 parts) | Same as Ex. A1 (8 parts) | Same as Ex. A1 (30 parts) | Dibutyl sebacate (5 parts) |
| A4 | Same as Ex. A1 (46 parts) | Same as Ex. A1 (54 parts) | Same as Ex. A1 (8 parts) | Same as Ex. A1 (30 parts) | Trimethyl phosphate (20 parts) |
| A5 | Same as Ex. A1 (46 parts) | Same as Ex. A1 (50 parts) | Same as Ex. A1 (8 parts) | Same as Ex. A1 (30 parts) | Triethyl phosphate (15 parts) |
| A6 | Same as Ex. A1 (46 parts) | Same as Ex. A1 (54 parts) | Same as Ex. A1 (8 parts) | Same as Ex. A1 (30 parts) | Dicyclohexyl phthalate (8 parts) |
| A7 | Same as Ex. A1 (46 parts) | Same as Ex. A1 (54 parts) | Same as Ex. A1 (8 parts) | Same as Ex. A1 (30 parts) | Diheptyl phthalate (8 parts) |
| Comp. Ex. A1 | Same as Ex. A1 (46 parts) | Same as Ex. A1 (54 parts) | Same as Ex. A1 (8 parts) | Same as Ex. A1 (26 parts) | None |

These photoresist films were used to prepare back plates of PDP. Ribs in the back substrate of PDP had a height of 120 μm, a rib spacing of 200 μm, and a trough cell depth of 120 μm, and a trough width of 80 μm.

The photoresist film was put on the surface of the cell so that the photosensitive resin layer in the photoresist film faced the surface of the cell. The assembly was then passed through between rubber rolls for lamination. Thus, the photosensitive resin layer was pressed into the cells. The polyester film was then separated and removed. After the separation, exposure and development were carried out in the same manner as in Example A1 through the cells and a photomask having a pixel pattern of the same color as the luminescent color of the fluorescent substance. Thereafter, drying and firing were carried out in the same manner as in Example A1 to form a fluorescent substance layer, thereby preparing a back plate of PDP (for only one color).

The adhesion of the fluorescent substance layer in the above back plate of PDP was visually inspected. Basically, no difference in brightness was observed between the examples and the comparative example.

TABLE A2

| Examples | Adhesion |
|---|---|
| A1 | ◯ |
| A2 | ◯ |
| A3 | ◯ |
| A4 | ◯ |
| A5 | ◯ |
| A6 | ◯ |
| A7 | ◯ |
| Comp. Ex. A | X |

◯ . . . Lifting of the fluorescent substance from the substrate was not observed at all.
X . . . The fluorescent substance was separated from the substrate, and substantially no fluorescent substance was left on the substrate.

According to the photoresist film of the present invention, the photosensitive resin composition layer laminated on the base film contains a relatively large amount of a volatile organic material. Therefore, pressing of the composition layer into cells of the back plate of PDP followed by drying and volatilization treatment at a suitable temperature causes the volume of the photosensitive resin composition in the cells to be reduced, creating a satisfactory discharge space. In the subsequent firing, since the amount of the organic material to be fired has been reduced in the above step, the time and thermal energy necessary for burning off the organic material are small. Further, in this case, the amount of gases evolved in the firing is small, facilitating the control of a firing oven.

The greatest advantage is such that a satisfactorily large discharge space is formed and, in addition, the finally formed fluorescent substance layer is satisfactorily adhered to the surface of cells and, unlike the prior art technique, does not cause lifting or separation of the fluorescent substance and other unfavorable phenomena.

Example B1
Preparation of photosensitive resin composition 23 parts of the following base polymer, 27 parts of the following ethylenically unsaturated compound, 4 parts of the following photopolymerization initiator, 128 parts of the following fluorescent substance, and 20 parts of the following volatile organic material were mixed together to prepare a photosensitive resin composition.
(Base polymer)

A copolymer (acid value 143.3, glass transition point 66.3° C., weight average molecular weight 80,000) of methyl methacrylate/n-butyl methacrylate/2-ethylhexyl acrylate/methacrylic acid in a comonomer weight ratio of 55/8/15/22.
(Ethylenically unsaturated compound)

A mixture of trimethylolpropane triacrylate/polyethylene glycol (600) dimethacrylate/ethylene oxide-modified phthalic acid acrylate (manufactured by Kyoeisha Chemical Co., Ltd.) in a weight ratio of 20/10/6.
(Photopolymerization initiator)

A mixture of benzophenone/p,p'-diethylaminobenzophenone/2,2-bis(o-chlorophenyl)-4,5,4', 5'-tetraphenyl-1,2'-biimidazole in a weight ratio of 8/0.15/1.
(Fluorescent substance)

Blue-emitting fluorescent substance: $BaMgAl_{10}O_{17}$:Eu (tradename: KX-501A, manufactured by Kasei Optonix, Ltd.) Red-emitting fluorescent substance: $Y_2O_3$:Eu (tradename: LP-REI, manufactured by Kasei Optonix, Ltd.) Green-emitting fluorescent substance: $Zn_2SiO_4$:Mn (tradename: P1-G1S, manufactured by Kasei Optonix, Ltd.)
(Volatile organic material)

Dioctyl phthalate (boiling point: 390° C. at 760 mmHg, 225–230° C. at 4 mmHg)
Preparation of dry film The above photosensitive composition was coated onto a 20 μm-thick polyester film by means of a blade coater, and the coating was allowed to stand at room temperature for 1.5 min and dried in an oven of 90° C. for 30 min, thereby forming a dry film having a photosensitive resin composition layer thickness of 30 μm according to the present invention. In this dry film, no protective film was provided.
Lamination onto glass substrate The dry film was laminated onto a glass substrate [a substrate, for a fluorescent substance face, having thereon a conductive circuit and barrier ribs (height 150 μm, width 50 μm, pitch 200 μm)], which had been preheated at 60° C. in an oven, under conditions of a laminating roll temperature of 100° C., a laminating roll pressure of 3 kg/cm², and a lamination rate of 1.5 m/min. Thereafter, the laminated film was air pressed under conditions of a pressure of 0.1 kg/cm² and a temperature of 100° C. for 5 min.

Exposure and development

After the air pressing, a pattern mask was put on top of the surface of the laminate film so that exposed areas in a fluorescent substance face pattern form (line spacing 110 μm, pitch 200 μm) were formed, followed by exposure at 400 mJ/cm² of light from a 3 kw ultrahigh pressure mercury lamp by means of an exposing machine MAP-200 manufactured by Dainippon Screen Mfg. Co., Ltd. After the exposure, a hold time of 15 min was provided, the polyester film was separated and removed, and development was carried out at 20° C. using a 1% aqueous sodium carbonate solution for a period of time which was 1.5 times longer than the minimum development time. Subsequently, post-baking (hydroextraction and drying) was carried out at 160° C. for 30 min. The above procedure was repeated for each of the dry films respectively containing fluorescent substances for emission of three colors.

Drying

After the development, the whole assembly was dried in a drying oven of 250° C. and 4 mmHg for 10 min, thereby evaporating and removing dioctyl phthalate contained in the photosensitive composition layer.

Firing

After the drying, the glass substrate with the fluorescent substance compositions for three colors filled thereinto in the above step was heated in a firing oven from room temperature to 550° C. over a period of one hr, thereby burning off the resin component in the fluorescent substance composition layer to form a fluorescent substance layer. Thus, a back plate of PDP was prepared. In the back plate, the fluorescent substance layer was satisfactorily adhered to the substrate, there was no lifting of the fluorescent substance layer, and a satisfactory discharge space could be ensured.

Examples B2 to B4

As given in Table B1, photosensitive resin compositions were prepared in the same manner as in Example B1, except that the formulation of the photosensitive composition was varied. Dry films were prepared in the same manner as in Example B1, except that the photosensitive resin compositions prepared just above were used. In Example B2, the step of drying was not carried out.

These dry films were used to prepare back plates of PDP. Ribs in the back substrate of PDP had a height of 150 μm, a rib spacing of 200 μm, and a rib width of 50 μm. Therefore, the trough cell depth was 150 μm, and the trough width was 150 μm.

The dry film was put on the surface of the cell so that the photosensitive resin layer in the dry film faces the surface of the cell. The assembly was then passed through between rubber rolls for lamination. Thus, the photosensitive resin layer was pressed into the cell. The polyester film was then separated and removed, and air pressing was carried out in the same manner as in Example B1. After the air pressing, exposure and development were carried out in the same manner as in Example B1 through the cell and a photomask having a pixel pattern of the same color as the luminescent color of the fluorescent substance. Thereafter, drying and firing were carried out in the same manner as in Example B1 to form a fluorescent substance layer, thereby preparing a back plate of PDP (for only one color). In the back plate, the fluorescent substance layer was satisfactorily adhered to the substrate, there was no lifting of the fluorescent substance layer, and a satisfactory discharge space could be ensured.

Example B5

A back plate of PDP was prepared in the same manner as in Example B1, except that the pressing of the dry film was carried out using a "water jet resin deburring apparatus (AX series)" manufactured by Rix Corp. at a water temperature of 80° C. and a water pressure of 5 kgf/cm². In the back plate, the fluorescent substance layer was satisfactorily adhered to the substrate, there was no lifting of the fluorescent substance layer, and a satisfactory discharge space could be ensured.

Comparative Example B1

A dry film was prepared in the same manner as in Example B1, except that the thickness of the photosensitive composition layer was 160 μm. This dry film was used to prepare a back plate of PDP in the same manner as in Example B1, except that the filling of the cells was carried out by lamination alone without using the air pressing. As a result, only a small discharge space was created in the final form of the cells after the firing.

Comparative Example B2

A back plate of PDP was prepared in the same manner as in Example B1, except that the amount of the fluorescent substance in the components constituting the photosensitive resin composition was changed to 17 parts, a dry film having

TABLE B1

| Example | Base polymer | Ethylenically unsaturated compound | Photopolymerization initiator | Fluorescent substance | Volatile organic material | Solvent |
| --- | --- | --- | --- | --- | --- | --- |
| B2 | Same as Ex. B1 (23 parts) | Same as Ex. B1 (27 parts) | Same as Ex. B1 (4 parts) | Same as Ex. B1 (128 parts) | None | 3-Methoxy-3-methyl butanol (20 parts) |
| B3 | Same as Ex. B1 (23 parts) | Same as Ex. B1 (27 parts) | Same as Ex. B1 (4 parts) | Same as Ex. B1 (128 parts) | Dibutyl sebacate (5 parts) | 3-Methoxy-3-methyl butanol (20 parts) |
| B4 | Same as Ex. B1 (23 parts) | Same as Ex. B1 (27 parts) | Same as Ex. B1 (4 parts) | Same as Ex. B1 (128 parts) | Trimethyl phosphate (20 parts) | 3-Methoxy-3-methyl butanol (20 parts) | a coating thickness of 160 μm was formed, and the filling of the cells was carried out by lamination alone without using the air pressing. In Comparative Example B2, theoretically, since the absolute amount of the fluorescent substance is the same as that in Example B1, the discharge space in the final form of the cells after the firing is identical to that in Example B1. Since, however, the resin content of the coating in the dry film was so high that the fluorescent substance layer was unfavorably separated during the firing.

According to the present invention, the dry film used in the present invention has a smaller thickness than the cell depth and is pressed into the cells. This permits a satisfactorily large discharge space to be formed in the back plate. In the subsequent firing, since the amount of the organic material to be fired is small, the time and thermal energy necessary for burning off the organic material are small. Further, in this case, the amount of gases evolved in the firing is small, facilitating the control of a firing oven.

The greatest advantage of the present invention is such that a satisfactorily large discharge space is formed within the cells and, in addition, the finally formed fluorescent substance layer within the cells is satisfactorily adhered to the surface of cells and, unlike the prior art technique, does not cause lifting or separation of the fluorescent substance and other unfavorable phenomena.

Example C1

Preparation of photosensitive resin composition layer 23 parts of the following base polymer, 27 parts of the following ethylenically unsaturated compound, 4 parts of the following photopolymerization initiator, 128 parts of the following inorganic powder, and 20 parts of the following volatile organic material were mixed together to prepare a composition for a photosensitive resin layer.

(Base polymer)

A copolymer (acid value 143.3, glass transition point 66.3° C., weight average molecular weight 80,000) of methyl methacrylate/n-butyl methacrylate/2-ethylhexyl acrylate/methacrylic acid in a comonomer weight ratio of 55/8/15/22.

(Ethylenically unsaturated compound)

A mixture of trimethylolpropane triacrylate/polyethylene glycol (600) dimethacrylate/ethylene oxide-modified phthalic acid acrylate (manufactured by Kyoeisha Chemical Co., Ltd.) in a weight ratio of 20/10/6.

(Photopolymerization initiator)

A mixture of benzophenone/p,p'-diethylaminobenzophenone/2,2-bis(o-chlorophenyl)-4,5,4',5'-tetraphenyl-1,2'-biimidazole in a weight ratio of 8/0.15/1.

(Volatile organic material)

Dioctyl phthalate (boiling point: 390° C. at 760 mmHg, 225–230° C. at 4 mmHg)

(Inorganic powder)

Calcium carbonate (S4#100, manufactured by Fuji Seisakusho Co., Ltd.)

Preparation of composition for fluorescent substance-containing layer

Each of the three color fluorescent substances was thoroughly dispersed in a solution of ethyl cellulose having a molecular weight of 50,000 in a mixed solvent composed of butyl carbitol acetate (BCA) and terpineo, thereby preparing fluorescent substance pastes for three colors. The formulations were as tabulated in Table C1.

TABLE C1

| | Fluorescent substance (wt %) | Ethyl cellulose (wt %) | Solvent (wt %) |
|---|---|---|---|
| Blue fluorescent substance paste | 27 | 6 | 67 |
| Green fluorescent substance paste | 25 | 6 | 59 |
| Red fluorescent substance paste | 35 | 6 | 59 |

(Fluorescent substance)

Blue-emitting fluorescent substance: $BaMgAl_{10}O_{17}:Eu$ (tradename: KX-501A, manufactured by Kasei Optonix, Ltd.)

Green-emitting fluorescent substance: $Zn_2SiO_4:Mn$ (tradename: P1-G1S, manufactured by Kasei Optonix, Ltd.)

Red-emitting fluorescent substance: $Y2O_3:Eu$ (tradename: LP-REI, manufactured by Kasei Optonix, Ltd.)

Preparation of dry film

The above photosensitive resin composition was coated onto a 20 μm-thick polyester film by means of a blade coater, and the coating was allowed to stand at room temperature for 1.5 min and dried in an oven of 90° C. for 30 min, thereby forming a dry film 10 having a photosensitive composition layer thickness of 30 μm according to the present invention (FIG. 5A). In this dry film, no protective film was provided.

Formation of fluorescent substance-containing layer

The fluorescent substance-containing layer (red) was coated onto a substrate for a fluorescent substance face (a work substrate) by blade coating, and the coating was dried at 120° C. for 60 min, thereby forming a fluorescent substance-containing layer having a thickness of 30 μm as measured from the bottom of the ribs (FIG. 6A).

Lamination of photosensitive resin layer onto glass substrate

The dry film 10 was laminated three times onto a glass substrate [a substrate, for a fluorescent substance face, having thereon a conductive circuit and barrier ribs (height 150 μm, width 50 μm, pitch 200 μm) and the fluorescent substance-containing layer formed above], which had been preheated at 60° C. in an oven, under conditions of a laminating roll temperature of 100° C., a laminating roll pressure of 6 kg/cm², and a lamination rate of 1.5 m/min. After the third lamination, the substrate film in the dry film was not separated. Thus, the photosensitive resin layer was filled on the fluorescent substance-containing layer (FIG. 6B).

Exposure, development, and blasting

A pattern mask was put on top of the surface of the substrate film in the substrate, with the photosensitive resin layer filled thereinto, so that exposed areas in a fluorescent substance face pattern form (line spacing 110 μm, pitch 200 μm) were formed, followed by exposure at 400 mJ/cm² of light from a 3 kw ultrahigh pressure mercury lamp by means of an exposing machine MAP-200 manufactured by Dainippon Screen Mfg. Co., Ltd. (FIG. 6C). After the exposure, a hold time of 15 min was provided, the polyester film as the substrate film was separated and removed, and development was carried out at 20° C. using a 0.5% aqueous sodium carbonate solution. The development time was 1.5 times longer than the minimum development time (FIG. 6D). Subsequently, prebaking (hydroextraction and drying) was carried out at 120° C. for 30 min.

Thereafter, sandblasting was carried out using as a mask the cured photosensitive resin layer α', which had not been removed by the development, to remove the unnecessary fluorescent substance-containing layer (FIG. 6E). The above procedure was repeated using the remaining compositions respectively containing green- and blue-emitting fluorescent substances and the dry film 10 (FIGS. 7A to 8B). The cured photosensitive resin layer α' was removed by development with a 1% aqueous caustic soda solution at 20° C. in substantially the same development time as described above, thereby preparing a glass substrate provided with fluorescent substance-containing layers for three colors (FIG. 8C). The sandblasting was carried out using an alumina powder (FO#800, manufactured by Fujimi Incorporated) under conditions of pressure 3 kgf and nozzle spacing 10 cm. In this case, the sandblasting is unnecessary for the layer, containing a blue-emitting fluorescent substance, which has been formed last.

Firing

The glass substrate with the fluorescent substance compositions, for three colors, filled thereinto in the above step was heated in a firing oven from room temperature to 550° C. over a period of one hr, thereby burning off the resin component in the fluorescent substance composition layer to form a fluorescent substance layer. Thus, a back plate of PDP was prepared. In the back plate, the fluorescent substance layer was satisfactorily adhered to the substrate, there was no lifting of the fluorescent substance layer, and a satisfactory discharge space could be ensured.

Examples C2 to C4

As given in the following table C2, compositions for photosensitive resin layers were prepared in the same manner as in Example C1, except that the formulation of the composition for the photosensitive resin layer was varied. Dry films 510 (FIG. 5A) were prepared in the same manner as in Example C1, except that the compositions for the photosensitive layers prepared just above were used.

repeated to form fluorescent substance layers. Thus, the fluorescent substance surface could be formed with the photosensitive resin layer left as a mask for blasting. Thereafter, the photosensitive resin layer was separated and removed, and firing was carried out to form fluorescent substance layers, thereby preparing a back plate of PDP. In the back plate, the fluorescent substance layer was satisfactorily adhered to the substrate, there was no lifting of the fluorescent substance layer, and a satisfactory discharge space could be ensured.

Example C5

A dry film was prepared in the same manner as in Example C1, except that, for the photosensitive resin layer, the thickness was 150 μm and no volatile organic solvent was used. Fluorescent substance-containing compositions specified in Table C3 prepared in the same manner as in Example C1 were blade-coated on the surface of the photosensitive resin layer in the dry film, followed by drying at 120° C. for 60 min, thereby forming 30 μm-thick fluorescent substance-containing layers. Thus, dry films 10' for three colors (FIG. 5B) of the present invention were prepared.

TABLE C3

| | Fluorescent substance (wt %) | Ethyl cellulose (wt %) | Volatile organic compound | Solvent (wt %) |
|---|---|---|---|---|
| Blue-emitting Fluorescent substance paste | 27 | 6 | Dibutyl sebacate (40 wt %) | 20 |

TABLE C2

| Example | Base polymer | Ethylenically unsaturated compound | Photopolymerization initiator | Inorganic powder | Volatile organic material | Solvent |
|---|---|---|---|---|---|---|
| C2 | Same as Ex. C1 (23 parts) | Same as Ex. C1 (27 parts) | Same as Ex. C1 (4 parts) | A noted below (128 parts) | None | 3-Methoxy-3-methyl butanol (20 parts) |
| C3 | Same as Ex. C1 (23 parts) | Same as Ex. C1 (27 parts) | Same as Ex. C1 (4 parts) | B noted below (128 parts) | Dibutyl sebacate (5 parts) | 3-Methoxy-3-methyl butanol (20 parts) |
| C4 | Same as Ex. C1 (23 parts) | Same as Ex. C1 (27 parts) | Same as Ex. C1 (4 parts) | C noted below (128 parts) | Trimethyl phosphate (20 parts) | 3-Methoxy-3-methyl butanol (20 parts) |

A: Calcium carbonate (S4#100, manufactured by Fuji Seisakusho Co., Ltd.)
B: Silicon carbide powder (GC#100, manufactured by Fujimi Incorporated)
C: Alumina powder (A#1000, manufactured by Fujimi Incorporated)

These dry films 510 were used to prepare back plates of PDP. Ribs in the back substrate of PDP had a height of 150 μm, a rib spacing of 200 μm, and a rib width of 50 μm. Therefore, the trough cell depth was 150 μm, and the trough width was 150 μm.

A fluorescent substance-containing layer was formed on the cell surface, the dry film was laminated so as to face the fluorescent substance-containing layer, and the laminate was then passed through between rubber rolls for lamination. This procedure was repeated three times to press the photosensitive resin layer into the cells. After the third pressing of the photosensitive resin layer into the cells, the substrate film was not separated. Exposure was then carried out in the same manner as in Example C1 through a photomask having the same pixel pattern as the fluorescent substance in the cells. Thereafter, the substrate film in the dry film was separated and removed, and development and blasting were carried out to form a fluorescent substance layer for a first color. For the two other colors, the above procedure was TABLE C3-continued

| | Fluorescent substance (wt %) | Ethyl cellulose (wt %) | Volatile organic compound | Solvent (wt %) |
|---|---|---|---|---|
| Green-emitting Fluorescent substance paste | 25 | 6 | Dioctyl phthalate (39 wt %) | 20 |
| Red-emitting Fluorescent substance paste | 35 | 6 | Dibutyl sebacate (39 wt %) | 20 |

A back plate of PDP was prepared using the above dry films according to a process shown in FIGS. 9 to 11. In the back plate, the fluorescent substance layer was satisfactorily adhered to the substrate, there was no lifting of the fluorescent substance layer, and a satisfactorily large discharge space could be ensured.

In the dry film having the above construction used in the present invention, after pressing of the photosensitive resin layer in the dry film into the cells, the photosensitive resin layer is separated and removed from the cells while leaving a thin fluorescent substance layer within the cells, followed by patterning. Therefore, in firing in the subsequent step, the amount of the organic material to be burned off is so small that the time and the thermal energy necessary for burning off the organic material are small, and, in addition, the amount of gases evolved in the firing is small, facilitating the control of a firing oven. Furthermore, a satisfactorily large discharge space is created in the cells, and the fluorescent substance layer finally formed in the cells is satisfactorily adhered to the surface of cells and, unlike the prior art technique, does not cause lifting or separation of the fluorescent substance and other unfavorable phenomena.

In the prior art technique, the mask exposure for the formation of three-color-emitting fluorescent substance layers should be carried out three times. By contrast, according to the method of the present invention, desired fluorescent substance layers for three respective colors can be formed by conducting the exposure twice.

Example D1

A substrate having a rib height of 150 μm, a rib width of 50 μm, and a rib pitch of 200 μm was provided for a back plate. A positive-working photosensitive resin solution prepared by adding 30 parts by weight of a solvent ECA (ethyl cellosolve acetate) to 70 parts by weight (solid basis) of a composition composed of a 8:2 (weight ratio) mixture of a novolak resin (represented by the following chemical formula 1) and naphthoquinonediazide (represented by the following chemical formula 2)/trihydrobenzophenone as a photoactive agent, stirring the mixture at room temperature to dissolve the resin and the photoactive agent in the solvent, filtering the solution to remove insolubles was used as a positive-working photosensitive resin for filling into between ribs of the substrate.

This photosensitive resin solution was coated by means of a blade coater onto the surface of the substrate to such a thickness that the top surface of the coating was 90 μm above the apex of the ribs, followed by drying in a clean oven at 120° C. for 30 min. After the drying, the thickness of the photosensitive resin layer was such that the top surface of the photosensitive resin layer was 10 μm above the apex of the ribs (see FIG. 12A).

As shown in FIG. 12B, ultraviolet light (wavelength 365 nm) was applied in an quantity of light of 500 mJ/cm² through a photomask to the photosensitive resin layer, and the exposed photosensitive resin layer was subjected to spray development at a pressure of about 1 kg/cm² with a 1 wt % aqueous KOH alkali solution to remove the photosensitive resin layer 76 located in a position, between ribs, where a blue-emitting fluorescent substance layer is to be formed (FIG. 12C).

In this example, a fluorescent substance-containing dry film was used as the fluorescent substance composition. The base polymer for the dry film was a copolymer of methyl methacrylate/n-butyl methacrylate/2-ethylhexyl acrylate/methacrylic acid (comonomer ratio on weight basis: 50/10/20/20). Regarding fluorescent substances contained in respective dry films, KX-501A (tradename, manufactured by Kasei Optonix, Ltd.) (composition: $(Ba,Eu)MgAl_{10}O_{17}$) was used for a blue fluorescent substance, P1-G1S (tradename, manufactured by Kasei Optonix, Ltd.) (composition: $(Zn,Mn)_2SiO_4$) was used for a green fluorescent substance, and LP-REI (tradename, manufactured by Kasei Optonix, Ltd.) (composition: $(Y,Eu)_2O_3$) for a red fluorescent substance.

The base polymer, the fluorescent substance, and a solvent (3-methoxy-3-methyl-1-butanol) were mixed together in the following mixing ratio to a dispersion of each fluorescent substance.

Blue-emitting fluorescent substance: base polymer:solvent=27:63:10

Red-emitting fluorescent substance: base polymer:solvent=35:55:10

Green-emitting fluorescent substance: base polymer:solvent=35:55:10

The dispersions were coated onto a 20 μm-thick polyester film by means of a blade coater, and the coatings were dried in an oven at 90° C. for 30 min, thereby forming 160 μm-thick dry films for three respective colors.

The dry film containing a blue-emitting fluorescent substance was press-laminated onto a substrate, for a back plate, which had been preheated at 60° C. in an oven, under conditions of a laminating roll temperature of 100° C., a laminating roll pressure of 3 kg/cm², and a lamination rate of 1.5 m/min. to fill a fluorescent substance-containing layer 77 in the dry film into a rib space 76, from which the positive-working resist has been removed (FIG. 12D), until the dry film reached the bottom of the space.

As shown in FIG. 13A, the surface was then abraded with a grinder to form a smooth surface. Thereafter, for the dry film for red and the dry film for green, exposure,

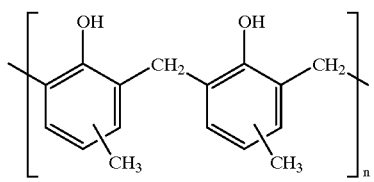

(1)

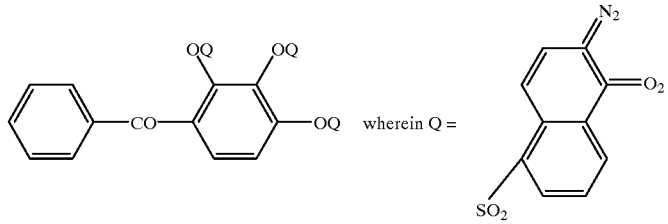

(2)

development, lamination of the fluorescent substance-containing dry film, and abrading were carried out in the same manner as described above to fill the layer containing a red-emitting fluorescent substance and the layer containing a green-emitting fluorescent substance into respective spaces between ribs.

Thereafter, the substrate for the back plate was placed in a firing oven, and firing was carried out by raising the temperature from room temperature to 550° C. over a period of one hr to burn off the resin component in the fluorescent substance composition. Thus, a back plate of PDP with fluorescent substance layers for emission of three respective colors formed thereon was prepared (FIG. 15B).

Example D2

A photosensitive resin solution was prepared in the same manner as in Example 1, except that a glass powder (silicate glass, particle diameter: 3±0.5 μm, specific gravity: 6.5) was incorporated as an inorganic powder in the following proportion into the same positive-working photosensitive resin solution as used in Example D1.

Novolak resin:photoactive agent:glass powder=16:4:80 (on solid basis)

Resin solution (on solid basis): solvent=70:30

A back plate of PDP with fluorescent substance layers for three colors formed therein was prepared in the same manner as in Example D1, except that the photosensitive resin solution prepared just above was used (FIG. 15B).

Example D3

The photosensitive resin solution prepared in Example D2 was coated onto a 20 μm-thick polyester film by means of a blade coater, and the coating was dried in an oven at 90° C. for 30 min, thereby forming a 160 μm-thick layer. Thus, a dry film having a positive-working photosensitive resin layer was prepared. This dry film was used to fill the positive-working photosensitive resin layer into a space between ribs under the same conditions as used in the lamination of the fluorescent substance-containing dry film in Example D1. Thereafter, the procedure of Example D1 was repeated to prepare a back plate of PDP with fluorescent substance layers respectively for emission of three layers formed therein (FIG. 15B).

Example D4

A back plate of PDP with fluorescent substance layers respectively for emission of three colors formed therein (FIG. 15B) was prepared in the same manner as in Example D1, except that the dispersion before the preparation of the fluorescent substance-containing dry film was used instead of the fluorescent substance-containing dry film in Example D1.

According to the present invention, a back plate of PDP, which does not suffer from mixing of red-, green-, and blue-emitting fluorescent substances, can emit pure RGB (red, green, and blue) lights, and can display a high-quality image can be provided in a cost-effective manner without wasting the fluorescent substance.

What is claimed is:

1. A composition, for a back plate of a plasma display panel, comprising a positive-working photosensitive resin and a filler which does not deteriorate the photosensitivity of the resin, the filling being selected from the group consisting of plastic pigment, glass material and extender pigments.

2. The composition according to claim 1, which is of a dry film type and provided as a layer onto a substrate film.

3. The composition according to claim 1 or 2, wherein the content of the filler, which does not deteriorate the photosensitivity of the positive-working photosensitive resin, is 1 to 90 parts by weight based on 10 parts by weight of the positive-working photosensitive resin.

4. The composition according to claim 1, wherein the extender pigment is selected from the group consisting of silica, alumina, calcium carbonate and a mixture thereof.

* * * * *